(12) United States Patent
Dai et al.

(10) Patent No.: US 12,224,745 B2
(45) Date of Patent: Feb. 11, 2025

(54) CAPACITANCE DETECTION CIRCUIT AND METHOD, AND ELECTRONIC DEVICE

(71) Applicant: Tencent Technology (Shenzhen) Company Limited, Shenzhen (CN)

(72) Inventors: Yuan Dai, Shenzhen (CN); Ruirui Zhang, Shenzhen (CN); Ke Chen, Shenzhen (CN); Jie Lai, Shenzhen (CN); Siyuan Liu, Shenzhen (CN); Zhengyou Zhang, Shenzhen (CN)

(73) Assignee: TENCENT TECHNOLOGY (SHENZHEN) COMPANY LIMITED, Shenzhen (CN)

( * ) Notice: Subject to any disclaimer, the term of this patent is extended or adjusted under 35 U.S.C. 154(b) by 275 days.

(21) Appl. No.: 17/944,061

(22) Filed: Sep. 13, 2022

(65) Prior Publication Data

US 2023/0019197 A1    Jan. 19, 2023

Related U.S. Application Data

(63) Continuation of application No. PCT/CN2021/103066, filed on Jun. 29, 2021.

(30) Foreign Application Priority Data

Jul. 21, 2020 (CN) .......................... 202010706241.3

(51) Int. Cl.
*H03K 17/96* (2006.01)
*B25J 13/08* (2006.01)
(Continued)

(52) U.S. Cl.
CPC ........ *H03K 17/9622* (2013.01); *B25J 13/084* (2013.01); *G01R 27/2605* (2013.01);
(Continued)

(58) Field of Classification Search
None
See application file for complete search history.

(56) References Cited

U.S. PATENT DOCUMENTS 6,066,871 A * 5/2000 Ema .................. H10B 12/48
257/296
7,075,316 B2 * 7/2006 Umeda ............... G11C 27/024
324/686

(Continued)

FOREIGN PATENT DOCUMENTS

CN    104881186 A    9/2015
CN    105743483 A    7/2016
(Continued)

OTHER PUBLICATIONS

Tencent Technology, European Office Action, EP Patent Application No. 21847272.8, Jun. 26, 2024, 9 pgs.

(Continued)

*Primary Examiner* — Fred Tzeng
(74) *Attorney, Agent, or Firm* — Morgan, Lewis & Bockius LLP

(57) ABSTRACT

This application provides a capacitance detection circuit for detecting capacitance of a capacitor element within a capacitor array. The circuit includes a capacitance detection module for detecting a first capacitance of a first capacitor set, a second capacitance of a second capacitor set, and a third capacitance of the third capacitor set, the first capacitor set comprising the capacitor element and a row capacitor element in the same row of the capacitor array as the capacitor element, the second capacitor set comprising the capacitor element and a column capacitor element in the same column of the capacitor array as the capacitor element, the third capacitor set comprising the row capacitor element and the column capacitor element; and a processing module, con- (Continued)

Capacitance detection circuit 300

Processing module 320 — Capacitance detection module 310 — Capacitor array 400 figured to obtain the capacitance of the capacitor element according to the first capacitance, the second capacitance and the third capacitance.

19 Claims, 13 Drawing Sheets

(51) Int. Cl.
  *G01R 27/26* (2006.01)
  *G06F 3/041* (2006.01)
  *G06F 3/044* (2006.01)
(52) U.S. Cl.
  CPC .......... *G06F 3/0418* (2013.01); *G06F 3/0446* (2019.05); *H03K 2217/96074* (2013.01)

(56) References Cited

U.S. PATENT DOCUMENTS

| | | | | |
|---|---|---|---|---|
| 7,084,645 | B1* | 8/2006 | Umeda | G06V 40/1306 |
| | | | | 324/686 |
| 7,923,817 | B2* | 4/2011 | Chen | H01L 23/5223 |
| | | | | 257/532 |
| 9,501,180 | B2* | 11/2016 | Hung | G06F 3/0446 |
| 10,436,733 | B2 | 10/2019 | Meyer | |
| 10,949,032 | B2* | 3/2021 | Jiang | G06F 3/044 |
| 10,990,230 | B2* | 4/2021 | Jiang | G06F 3/0418 |
| 11,206,019 | B2* | 12/2021 | Jiang | G06F 3/044 |
| 11,293,961 | B2* | 4/2022 | Kurachi | H03K 17/955 |
| 11,346,873 | B2* | 5/2022 | Kurachi | G01R 27/2605 |
| 2005/0141263 | A1* | 6/2005 | Umeda | G06F 3/04182 |
| | | | | 365/149 |
| 2008/0099879 | A1* | 5/2008 | Chen | H01L 23/5223 |
| | | | | 257/532 |
| 2009/0201242 | A1 | 8/2009 | Govil | |
| 2013/0009905 | A1* | 1/2013 | Castillo | G06F 3/0414 |
| | | | | 345/174 |
| 2014/0327650 | A1* | 11/2014 | Lin | G06F 3/044 |
| | | | | 345/174 |
| 2015/0049043 | A1* | 2/2015 | Yousefpor | G06F 3/04186 |
| | | | | 345/174 |
| 2015/0049044 | A1* | 2/2015 | Yousefpor | G06F 3/04186 |
| | | | | 345/174 |
| 2015/0091859 | A1* | 4/2015 | Rosenberg | G06F 3/0446 |
| | | | | 345/174 |
| 2016/0334933 | A1* | 11/2016 | Ono | G06F 3/0446 |
| 2017/0261459 | A1* | 9/2017 | Meyer | G01N 27/226 |
| 2021/0033655 | A1* | 2/2021 | Jiang | G01D 5/24 |
| 2021/0034179 | A1* | 2/2021 | Fan | G06F 3/044 |
| 2021/0396605 | A1* | 12/2021 | Vardoulis | G01L 1/148 |

FOREIGN PATENT DOCUMENTS

| | | |
|---|---|---|
| CN | 107179852 A | 9/2017 |
| CN | 110262704 A | 9/2019 |
| CN | 111504521 A | 8/2020 |
| JP | 2015207078 A | 11/2015 |

OTHER PUBLICATIONS

Tencent Technology, ISR, PCT/CN2021/103066, Sep. 22, 2022, 2 pgs.
Tencent Technology, Extended European Search Report and Supplementary Search Report, EP21847272.8, Aug. 25, 2023, 9 Pgs.
Tencent Technology, WO, PCT/CN2021/103066, Sep. 22, 2021, 7 pgs.
Tencent Technology, IPRP, PCT/CN2021/103066, Jan. 24, 2023, 8 pgs.

* cited by examiner

CAPACITANCE DETECTION CIRCUIT AND METHOD, AND ELECTRONIC DEVICE

CROSS-REFERENCE TO RELATED APPLICATIONS

This application is a continuation application of PCT Patent Application No. PCT/CN2021/103066, entitled "CAPACITANCE MEASUREMENT CIRCUIT AND METHOD, AND ELECTRONIC DEVICE" filed on Jun. 29, 2021, which claims priority to Chinese Patent Application No. 202010706241.3, filed with the State Intellectual Property Office of the People's Republic of China on Jul. 21, 2020, and entitled "CAPACITANCE DETECTION CIRCUIT AND METHOD, AND ELECTRONIC DEVICE", all of which are incorporated herein by reference in their entirety.

FIELD OF THE TECHNOLOGY

This application relates to the technical field of robotics, and more specifically, to a capacitance detection circuit and method, and an electronic device.

BACKGROUND OF THE DISCLOSURE

When each capacitor element in a capacitor array is detected, a capacitor element in a capacitor array sensor is first touched and pressed, and then the change in capacitance of the capacitor element is detected. However, the detected capacitance is affected by other capacitor elements than the capacitor element, that is, the capacitance of other capacitor elements will affect the capacitance measurement of the capacitor to be tested. In addition, the influence changes slightly with the touch and pressing action, so it is not easy to be eliminated, resulting in an inaccurate detection result of the capacitance.

SUMMARY

Embodiments of this application provide a capacitance detection circuit and method, and an electronic device, to avoid inaccurate detection result of the capacitance caused by the influence of the change in capacitance of surrounding capacitor elements on the capacitance when a capacitor element is detected.

In a first aspect, an embodiment of this application provides a circuit for detecting capacitance of a capacitor element within a capacitor array. The capacitance detection circuit comprises: a capacitance detection module configured to detect a first capacitance of a first capacitor set, a second capacitance of a second capacitor set, and a third capacitance of a third capacitor set, the first capacitor set comprising the capacitor element and a row capacitor element in the same row of the capacitor array as the capacitor element, the second capacitor set comprising the capacitor element and a column capacitor element in the same column of the capacitor array as the capacitor element, the third capacitor set comprising the row capacitor element and the column capacitor element; and a processing module, configured to obtain the capacitance of the capacitor element according to the first capacitance, the second capacitance and the third capacitance.

In a second aspect, an embodiment of this application further provides a capacitance detection method, applicable to the detection of capacitance of a capacitor array, the capacitor array comprising multiple capacitor elements distributed in rows and columns. The method comprises: detecting a first capacitance of a first capacitor set, a second capacitance of a second capacitor set, and a third capacitance of the third capacitor set, the first capacitor set comprising a capacitor element in the capacitor array and a row capacitor element in the same row of the capacitor array as the capacitor element, the second capacitor set comprising the capacitor element and a column capacitor element in the same column of the capacitor array as the capacitor element, the third capacitor set comprising the row capacitor element and the column capacitor element; and obtaining the capacitance of the capacitor element according to the first capacitance, the second capacitance and the third capacitance.

In a third aspect, an embodiment of this application further provides an electronic device, comprising a capacitance detection circuit as described above, the electronic device being provided with an electronic skin on a surface, the electronic skin comprising a capacitor array, the capacitor array comprising multiple capacitor elements being distributed in rows and columns.

In a fourth aspect, an embodiment of this application further provides a non-transitory computer-readable storage medium, a program code being stored in the storage medium, and the program code being loaded and executed by a processor to implement the capacitance detection method described in the embodiments of this application.

BRIEF DESCRIPTION OF THE DRAWINGS

To describe the technical solutions in the embodiments of this application more clearly, the following briefly describes the accompanying drawings required for describing the embodiments. Apparently, the accompanying drawings in the following description show merely some embodiments of this application, and a person skilled in the art may still derive other drawings from these accompanying drawings without creative efforts.

DESCRIPTION OF EMBODIMENTS

To make solutions in this application more comprehensible for a person skilled in the art, the technical solutions in the embodiments of this application are clearly and completely described below with reference to the accompanying drawings in the embodiments of this application.

Before embodiments of this application are described, the technical terms involved in this application are explained.

Crosstalk refers to the influence of crosstalk between each capacitor element in a capacitor array when each capacitor element in a capacitor array sensor is detected. For example, a capacitor element in a capacitor array tactile sensor is touched and pressed, and when the capacitor element is detected for the capacitance, other capacitor elements than the capacitor element will affect the capacitance measurement of the to-be-detected capacitor element, causing each capacitor element to interfere with one another during the detection, and resulting in crosstalk. The influence changes slightly with the change of the touch and pressing action. That is to say, the pressing of a to-be-detected capacitor element will not only cause the change in the capacitance of the to-be-detected capacitor element, but also the change in the capacitance of other capacitor elements, so that the crosstalk is uneasy to be corrected.

Figure 1:
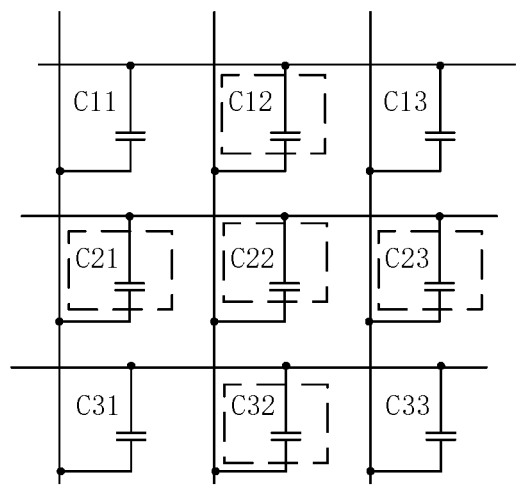
FIG. 1 is a schematic view showing a capacitor array having crosstalk provided in an embodiment of this application.
Figure 2:
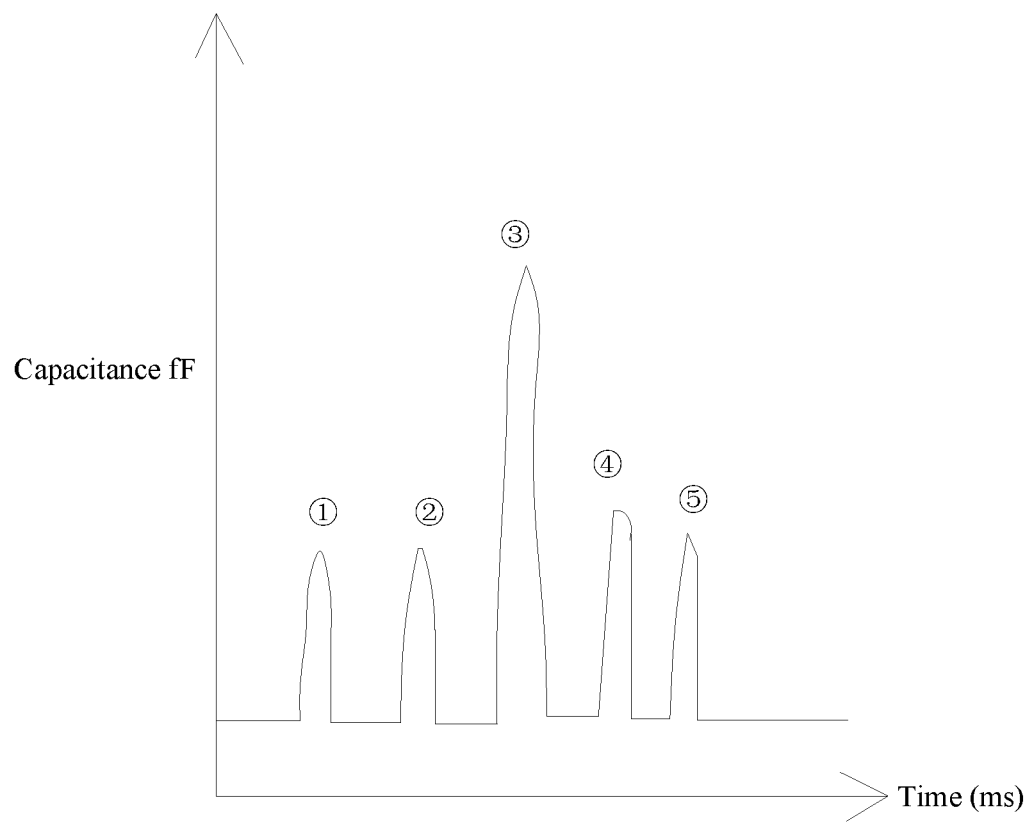
FIG. 2 is a schematic view showing a capacitance waveform caused by crosstalk provided in an embodiment of this application.

FIG. 1 is a schematic view showing a capacitor array having crosstalk. C21, C12, C22, C23 and C32 in the capacitor array tactile sensor are respectively pressed by a pressure gauge at the same speed and the same pressure value from the same height vertically right above these capacitor elements. Then, the capacitance of C22 is monitored in real time using an inductance capacitance resistance meter (LCR). The obtained waveform of capacitance of C22 is shown in FIG. 2. The 5 waveforms shown in FIG. 2 are all the measured waveforms of capacitance of C22. Among them, ①, ②, ④ and ⑤ respectively show the change in capacitance measured for C22 when C21, C12, C23 and C32 are pressed. It can be seen that when the capacitance of C22 is detected, it will be affected by the capacitance of surrounding capacitors, that is, C21, C12, C23 and C32. Therefore, there is a crosstalk between capacitors.

The crosstalk rate is defined as follows. When the capacitance of a capacitor at point B is caused to change by an action at no load, the change of the capacitance of point B will also cause the capacitance of point A to be affected by the crosstalk caused by the action. The maximum change in the self-capacitance of point A due to the crosstalk from point B is calculated and recorded as a first maximum value. Then the maximum change in the self-capacitance of point A caused by the action applied to point A is calculated, and recorded as a second maximum value. The ratio of the first maximum value to the second maximum value is defined as the crosstalk rate, where the action applied to point A is the same as the action applied to point B. The crosstalk rate is used to compare the influence of crosstalk on single-point capacitors. As shown in FIG. 1, the crosstalk rate on the capacitance of C22 due to the action applied to C21, C12, C23 and C32 is 36.4%, 38.6%, 47.7%, and 40.9% respectively.

At present, the solution to crosstalk includes capacitor array acquisition based on a capacitive-to-digital converter (CDC) detection chip. That is, the capacitance of each capacitor element in a capacitor array is detected separately by multiple channels of a dedicated capacitance acquisition chip, to relieve the crosstalk to a certain extent.

However, the above-mentioned solution for solving crosstalk has some shortcomings and is ineffective. Particularly, the capacitor array acquisition based on a CDC detection chip has the shortcomings that the number of sensors in the capacitor array is limited by the number of channels in the CDC sensor, so the method cannot be applied to large-size arrays; and the measurement of the capacitor array is not accurate enough.

Therefore, to overcome the above-mentioned defects and improve the accuracy of capacitance detection of the capacitor array, an embodiment of this application provides a capacitance detection circuit and method. In an implementation, the capacitance detection circuit and method provided in the embodiments of this application are applicable to the detection of the capacitance of an electronic device. For example, the electronic device may be a terminal with a touch screen, such as a mobile phone, and a tablet computer, etc. The touch screen includes a capacitor array, through which a user's touch operation on the touch screen is detected. By using the capacitance detection circuit and method provided in the embodiments of this application, the crosstalk between capacitors is reduced when a touch screen gesture is collected, thus improving the accuracy of gesture detection. For example, the electronic device may also be an intelligent robot, and particularly, the capacitance detection circuit and method provided in the embodiments of this application are applicable to an electronic skin of the robot. The currently available electronic skin tactile system for robots can only track a locally sensed signal according to a position at which the electronic skin is attached, and thus is difficult to accurately locate the contact point or approaching point of the robot's electronic skin. By using the capacitance detection circuit and method provided in the embodiments of this application, when an electronic skin is attached onto a surface of the robot, precise decoupling and reading of each capacitor element in the array can be achieved.

In another implementation, the capacitance detection circuit and method provided in the embodiments of this application are also applicable to the sensing and recognition of a capacitor array in a micro-nano scenario. With the development of micro-nano manufacturing technology, the size of a capacitor array becomes increasingly smaller, so it can be adapted to a tiny usage scenario (for example, detection of force distribution on a robot fingertip), or an ultra-high-resolution usage environment. Since the size of a contacted or approaching object is much larger than the size of the capacitor array, the capacitance of related capacitor elements in the array are prone to change, whereby the crosstalk between the capacitor elements becomes particularly serious when the tiny capacitor array senses the contact and approaching. Therefore, it becomes more difficult to accurately measure the capacitance of tiny capacitor arrays. With the capacitance detection circuit and method provided in the embodiments of this application, the size of the capacitor array is not limited, and even the crosstalk of a tiny capacitor array can also be completely decoupled, to obtain the real capacitance or capacitance change of each single-point capacitor. Therefore, the capacitance detection circuit and method provided in the embodiments of this application is applicable to the detection of force distribution in a tiny area.

It is to be understood that embodiments of this application are not limited to the application scenarios mentioned above, and embodiments of this application can also be used in other scenarios in which a capacitor array is used as a sensor to sense a touch or a pressing operation.

Figure 3:
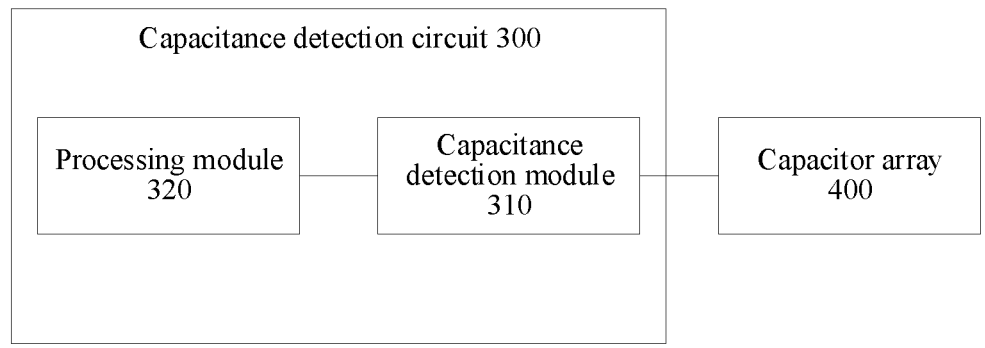
FIG. 3 is a schematic view showing a capacitance detection circuit provided in an embodiment of this application.

FIG. 3 shows a capacitance detection circuit provided in an embodiment of this application. A capacitance detection circuit 300 shown in FIG. 3 is applicable to a capacitor array, the capacitor array comprising multiple capacitor elements, and the multiple capacitor elements being distributed in rows and columns. The capacitance detection circuit 300 includes a capacitance detection module 310 and a processing module 320. The capacitance detection module 310 is configured to connect the capacitor array, and the processing module 320 is connected to the capacitance detection module 310.

Figure 4:
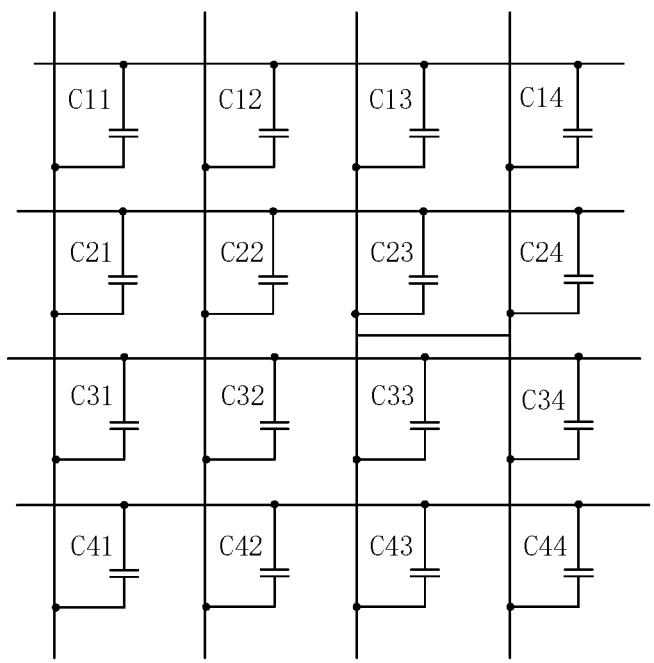
FIG. 4 is a schematic view showing a capacitor array provided in an embodiment of this application.

As shown in FIG. 4, the capacitor array includes multiple capacitor elements distributed in rows. For example, C21, C22, C23 and C24 are in the same row, and C13, C23, C33 and C43 are in the same column. The capacitor array shown in FIG. 4 includes 16 capacitor elements, distributed in 4 rows×4 columns. In an implementation, each capacitor is named according to the serial number of the determinant, that is, the capacitor in the first row and the first column is marked as C11, the capacitor in the first row and the second column is marked as C12, and the capacitor in an $i^{th}$ row and a $i^{th}$ column is marked as Cij. Therefore, each to-be-detected capacitor element corresponds to a capacitor element in the same row therewith and a capacitor element in the same column therewith. When the capacitor elements in the same row or column share a wire, as shown in FIG. 4, multiple capacitor elements C21, C22, C23 and C24 in the second row are connected to the wire in the second row, and multiple capacitor elements C13, C23, C33 and C43 in the third column are connected to the wire in the third column. Therefore, when a capacitor element is detected, the capacitance detection circuit will be connected to the wire in the row and the wire in the column corresponding to the capacitor element. Accordingly, the capacitor elements in the same row and the same column with the capacitor element will be selected. That is, the capacitor elements in the same row and the same column with the capacitor element will cause crosstalk to the capacitance of the to-be-detected capacitor element.

In an embodiment of this application, the capacitor element in the same row with the to-be-detected capacitor element is designated as a to-be-detected row capacitor element, and the capacitor element in the same column with the to-be-detected capacitor element is designated as a to-be-detected column capacitor element.

For example, if the to-be-detected capacitor element is C23, then the to-be-detected row capacitor element corresponding to the to-be-detected capacitor element is C21, C22 and C24, and the to-be-detected column capacitor element corresponding to the to-be-detected capacitor element is C13, C33 and C43.

The capacitance detection module 310 is configured to detect a first capacitance of a first capacitor set, a second capacitance of a second capacitor set and a third capacitance of a third capacitor set.

The first capacitor set includes a to-be-detected capacitor element and a to-be-detected row capacitor element. In an implementation, the to-be-detected capacitor element and the to-be-detected row capacitor element are connected in parallel to form the first capacitor set, and the first capacitance of the first capacitor set may be a parallel capacitance after the to-be-detected capacitor element and the to-be-detected row capacitor element are connected in parallel. In another implementation, the to-be-detected capacitor element and the to-be-detected row capacitor element are connected in series to form the first capacitor set, and the first capacitance of the first capacitor set may be a serial capacitance after the to-be-detected capacitor element and the to-be-detected row capacitor element are connected in series.

Since the first capacitance includes two variables, that is, the capacitance of the to-be-detected capacitor element and the capacitance of the to-be-detected row capacitor element, the real capacitance of the to-be-detected capacitor element cannot be obtained merely from the first capacitance. If the first capacitance is directly used as the real capacitance of the to-be-detected capacitor element, the detected capacitance is inaccurate. Therefore, in an embodiment of this application, the capacitance of the to-be-detected capacitor element is obtained from the first capacitance, the second capacitance and the third capacitance, to eliminate the influence of crosstalk of the to-be-detected row capacitor element and the to-be-detected column capacitor element on the real capacitance of the to-be-detected capacitor element. Particularly, reference can be made to subsequent descriptions.

Similarly, the second capacitor set includes the to-be-detected capacitor element and a to-be-detected column capacitor element. The to-be-detected capacitor element and the to-be-detected column capacitor element are connected in parallel or in series to form the second capacitor set. The second capacitance of the second capacitor set may be a parallel capacitance or a serial capacitance of the to-be-detected capacitor element and the to-be-detected column capacitor element. The third capacitor set includes the to-be-detected row capacitor element and the to-be-detected column capacitor element. The to-be-detected row capacitor element and the to-be-detected column capacitor element are connected in parallel or in series to form the third capacitor set. The third capacitance of the third capacitor set may be a parallel capacitance or a serial capacitance of the to-be-detected row capacitor element and the to-be-detected column capacitor element.

As shown in FIG. 4, for example, the to-be-detected capacitor element is C23, the to-be-detected row capacitor element is C21, C22 and C24, and the to-be-detected column capacitor element is C13, C33 and C43. When the capacitance of C23 is detected, the capacitance detection module is not connected to capacitor elements that are not in the same row and the same column with C23. For example, the capacitor elements that are not in the same row and the same column with C23 can be short-circuited to a ground terminal. Because the capacitor elements that are not in the same row and the same column with C23 hardly causes crosstalk to C23, they can be ignored. The capacitance detection module is connected to the to-be-detected row capacitor element and the to-be-detected column capacitor element that are in the same row or the same column with C23.

In an implementation, wires that are not in the same row and the same column with C23 are grounded. That is, the wires in the first row, the third row and the fourth row are grounded, and the wires in the first column, the second column, and the fourth column are grounded. As a result, two terminals of each of the capacitor elements that are not in the same row and the same column with C23 are grounded, that is, short circuited to earth.

In an implementation, the capacitance detection module can detect the first capacitance of the first capacitor set, the second capacitance of the second capacitor set and the third capacitance of the third capacitor set, via the discharge of the capacitor elements. Particularly, after the first capacitor set, the second capacitor set, or the third capacitor set is charged by the capacitance detection module, the charge Q carried by each capacitor element in the capacitor set, the voltage U between two electrode plates and the capacitance C meet the relationship of Q=CU. U can be measured by a DC voltmeter, and Q can be measured by the discharge of the capacitor element. For example, the capacitor element is discharged through a high-resistance resistor, and the discharge current decreases with the voltage drop between the two electrode plates of the capacitor element. By measuring the discharge current at various times until I=0, a curve of the discharge current I vs time is obtained, and the area under curve is equal to the charges carried by the capacitor element. Then, the capacitance of the capacitor element is obtained from C=Q/U.

In another implementation, the capacitance detection module can detect the first capacitance of the first capacitor set, the second capacitance of the second capacitor set and the third capacitance of the third capacitor set, by using the discharge time ratio. Particularly, the measurement principle is to connect the to-be-detected capacitor element and a reference capacitor to the same resistor to form an RC network. By measuring the ratio of the discharge time of the two capacitors, the capacitance of the test capacitor can be obtained.

In another implementation, the capacitance detection module can detect, based on CDC, the first capacitance of the first capacitor set, the second capacitance of the second capacitor set and the third capacitance of the third capacitor set. Particularly, the capacitance detection module can be a CDC chip, a capacitance detection circuit or a capacitance measuring instrument. Among them, the CDC chip is a dedicated CDC chip integrated with a CDC module unit for detecting the capacitance therein, which, combined with a simple peripheral circuit, can detect the capacitance of a capacitor element. The capacitance detection circuit is a circuit unit formed of discrete components and configured to measure the capacitance of a capacitor element. The capacitance is detected by converting a capacitance signal into a corresponding voltage or current signal, inputting the voltage or current signal into an analog-to-digital conversion (ADC) and reading. The capacitance measuring instrument may be an instrument such as LCR.

Figure 5:
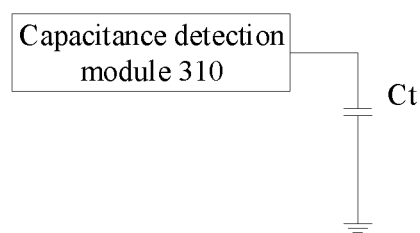
FIG. 5 is a schematic view showing a detection method for detecting the capacitance to earth provided in an embodiment of this application.

In an embodiment of this application, the detection of the capacitance of a capacitor element or a capacitor set by the capacitance detection module can be implemented by detecting the capacitance of the capacitor element to earth, for example, by a detection method shown in FIG. 5. In FIG. 5, Ct is a to-be-detected capacitor element, one terminal of the to-be-detected capacitor element is connected to the capacitance detection module, and the other terminal is grounded.

It is to be understood that in the embodiments of this application, the capacitance detection module is not limited to the above implementations, and any detection method enabling the detection of the capacitance of a capacitor element to earth can be used with the capacitance detection module in the embodiments of this application.

The processing module 320 is configured to obtain the capacitance of the to-be-detected capacitor element according to the first capacitance, the second capacitance and the third capacitance. Particularly, the first capacitance includes the capacitance of the to-be-detected capacitor element and the capacitance of the to-be-detected row capacitor element, the second capacitance includes the capacitance of the to-be-detected capacitor element and the capacitance of the to-be-detected column capacitor element, and the third capacitance includes the capacitance of the to-be-detected row capacitor element and the capacitance of the to-be-detected column capacitor element. There are three variables, namely the capacitance of the to-be-detected capacitor element, the capacitance of the be-test row capacitor element and the capacitance of the to-be-detected column capacitor element. The variables are solved from the first capacitance, the second capacitance, and the third capacitance, to obtain the capacitance of the to-be-detected capacitor element. For the specific algorithm, reference can be made to the following embodiments.

In an implementation, the processing module 320 may be a processor including one or more processing cores. The processor is connected to other devices or modules by various interfaces and wires, and controls other devices or modules by running or executing instructions, programs, code sets or instruction sets, or receives data transmitted from other devices or modules and processes the received data. In an embodiment, the processor may be implemented in at least one hardware form of a digital signal processor (DSP), a field-programmable gate array (FPGA), or a programmable logic array (PLA). The processor may integrate one of a central processing unit (CPU), a graphics processing unit (GPU), and a modem, or a combination thereof.

Therefore, when the capacitance of a to-be-detected capacitor element is calculated in an embodiment of this application, the capacitor sets corresponding to the first capacitance, the second capacitance, and the third capacitance each include at least one of the to-be-detected row capacitor element and the to-be-detected column capacitor element. Therefore, the influence of the capacitance of the to-be-detected row capacitor element and the to-be-detected column capacitor element on the capacitance of the to-be-detected capacitor element is considered, making the detected capacitance more accurate.

Figure 6:
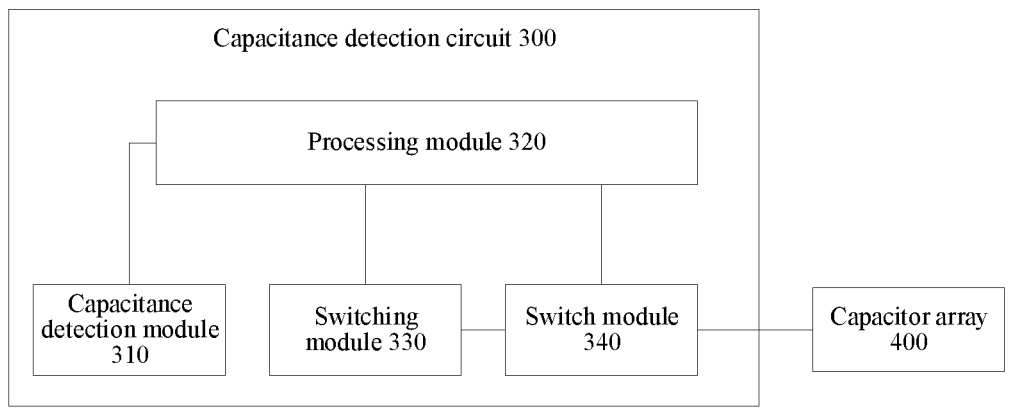
FIG. 6 is a schematic view showing a capacitance detection circuit provided in another embodiment of this application.

FIG. 6 shows a capacitance detection circuit provided in an embodiment of this application. Compared with FIG. 3, a capacitance detection circuit 300 shown in FIG. 6 further includes a switching module 330. The switching module 330 is configured to connect the capacitance detection module 310 respectively to the first capacitor set, the second capacitor set and the third capacitor set. Particularly, the switching module 330 is configured to connect the capacitance detection module to the to-be-detected capacitor element and the to-be-detected row capacitor element, connect the capacitance detection module to the to-be-detected capacitor element and the to-be-detected column capacitor element, and connect the capacitance detection module to the to-be-detected row capacitor element and the to-be-detected column capacitor element.

In an implementation, the capacitance detection module 310 is configured to connect respectively to the first capacitor set, the second capacitor set, and the third capacitor set via the switching module 330. In an implementation, the switching module 330 connects the capacitance detection module 310 to one of the first capacitor set, the second capacitor set, and the third capacitor set sequentially.

In some embodiments, the switching module 330 can be a switch, which enables the capacitance detection module 310 to connect to one of the first capacitor set, the second capacitor set, and the third capacitor set sequentially.

In an embodiment, the processing module 320 is connected to the switching module 330, and configured to control the capacitance detection circuit 300 to form three connection states.

Figure 7:
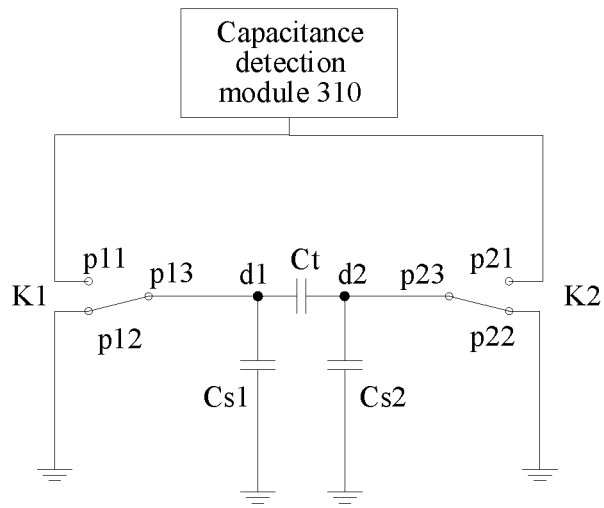
FIG. 7 is a schematic view showing the connection between a capacitance detection module, a switching module, and a to-be-detected capacitor element provided in an embodiment of this application.

As shown in FIG. 7, the switching module 330 includes a first switch K1, and a second switch K2. Both the first switch K1 and the second switch K2 includes a first contact, a second contact and a third contact. Particularly, the first contact, the second contact and the third contact of the first switch K1 are respectively p11, p12, and p13, the first contact, the second contact and the third contact of the second switch K2 are respectively p21, p22, and p23.

The first contact p11 of the first switch K1 and the first contact p21 of the second switch K2 are both connected to the capacitance detection module 310. The second contact p12 of the first switch K1 and the second contact p22 of the second switch K2 are both grounded. The third contact p13 of the first switch K1 is connected to a first terminal d1 of the to-be-detected capacitor element Ct, and grounded through the to-be-detected row capacitor element. The third contact p23 of the second switch K2 is connected to a second terminal d2 of the to-be-detected capacitor element Ct, and grounded through the to-be-detected column capacitor element.

The first switch K1 includes two states, namely a first state and a second state. In the first state, the first contact p11 and the third contact p13 of the first switch K1 are connected, and in the second state, the second contact p12 and the third contact p13 of the first switch K1 are connected. Similarly, the second switch K2 also includes two states. In a first state, the first contact p21 and the third contact p23 of the second switch K2 are connected, and in a second state, the second contact p22 and the third contact p23 of the second switch K2 are connected. In an embodiment, the processing module 320 can control the connection of the contacts in the first switch and the second switch to form three connection states.

When the processing module 320 controls the first switch K1 to be in the first state and the second switch K2 to be in the second state (that is, when the processing module 320 controls the capacity detection circuit 300 to form the first of the three connection states), the first terminal d1 of the to-be-detected capacitor element Ct is connected to the capacitance detection module 310, and the second terminal d2 of the to-be-detected capacitor element Ct is grounded. According to the aforementioned method of detecting the capacitance to earth, the capacitance detection module 310 is connected to one terminal of both the to-be-detected capacitor element Ct and the to-be-detected row capacitor element Cs1, and the other terminal of the to-be-detected capacitor element Ct and the to-be-detected row capacitor element Cs' is grounded; and both terminals of the to-be-detected column capacitor element Cs2 are grounded, that is, the to-be-detected column capacitor element Cs2 is short circuited to earth.

Figure 8:
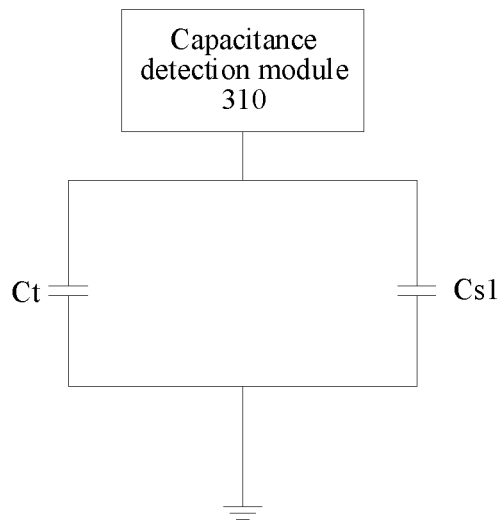
FIG. 8 shows an equivalent circuit diagram of a capacitance detection circuit provided in an embodiment of this application.

At this time, FIG. 7 is equivalent to FIG. 8. That is, the capacitance detection module 310 is connected to the first capacitor set at this time. It can be seen from FIG. 8 that the first capacitor set is a capacitor set formed by the to-be-detected capacitor element Ct and the to-be-detected row capacitor element Cs1 connected in parallel, and the measured first capacitance is a parallel capacitance of the to-be-detected capacitor element Ct and the to-be-detected row capacitor element Cs1. Assuming that the first capacitance is C1, then $C1=Ct+Cs1$, where Ct is the capacitance of the to-be-detected capacitor element Ct, and Cs1 is the capacitance of the to-be-detected row capacitor element Cs1.

When the processing module 320 controls the first switch K1 to be in the second state and the second switch K2 to be in the first state (that is, when the processing module 320 controls the capacitance detection circuit 300 to form the second of the three connection states), the first terminal d1 of the to-be-detected capacitor element Ct is grounded, and the second terminal d2 of the to-be-detected capacitor element Ct is connected to the capacitance detection module 310. According to the aforementioned method of detecting the capacitance to earth, the capacitance detection module 310 is connected to one terminal of both the to-be-detected capacitor element Ct and the to-be-detected column capacitor element Cs2, and the other terminal of the to-be-detected capacitor element Ct and the to-be-detected column capacitor element Cs2 is grounded; and both terminals of the to-be-detected row capacitor element Cs1 are grounded, that is, the to-be-detected row capacitor element Cs1 is short circuited to earth.

Figure 9:
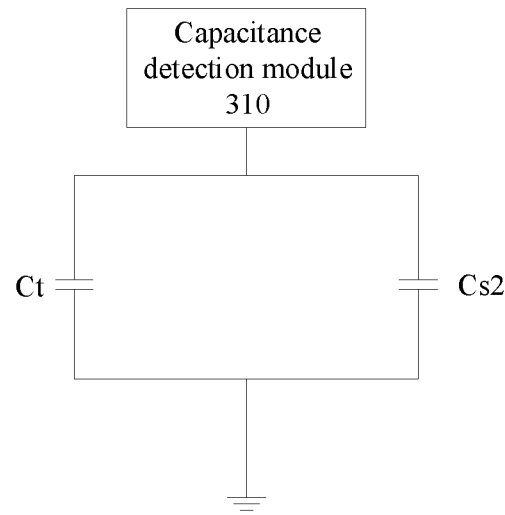
FIG. 9 shows an equivalent circuit diagram of a capacitance detection circuit provided in another embodiment of this application.

At this time, FIG. 7 is equivalent to FIG. 9. That is, the capacitance detection module 310 is connected to the second capacitor set at this time. It can be seen from FIG. 9 that the second capacitor set is a capacitor set formed by the to-be-detected capacitor element Ct and the to-be-detected column capacitor element Cs2 connected in parallel, and the measured second capacitance is a parallel capacitance of the to-be-detected capacitor element Ct and the to-be-detected column capacitor element Cs2. Assuming that the second capacitance is C2, then $C2=Ct+Cs2$, where Ct is the capacitance of the to-be-detected capacitor element Ct, and Cs2 is the capacitance of the to-be-detected column capacitor element Cs2.

When the processing module 320 controls the first switch K1 to be in the first state and the second switch K2 to be in the first state (that is, when the processing module 320 controls the capacity detection circuit 300 to form the third of the three connection states), the first terminal d1 of the to-be-detected capacitor element Ct is connected to the capacitance detection module 310, and the second terminal d2 of the to-be-detected capacitor element Ct is also connected to the capacitance detection module 310. According to the aforementioned method of detecting the capacitance to earth, the capacitance detection module 310 is connected to one terminal of both the to-be-detected row capacitor element Cs1 and the to-be-detected column capacitor element Cs2, and the other terminal of the to-be-detected row capacitor element Cs1 and the to-be-detected column capacitor element Cs2 is grounded; and both terminals of the to-be-detected capacitor element Ct are not grounded. Therefore, a method of detecting the capacitance to earth is not formed between the to-be-detected capacitor element Ct is and the capacitance detection module 310.

Figure 10:
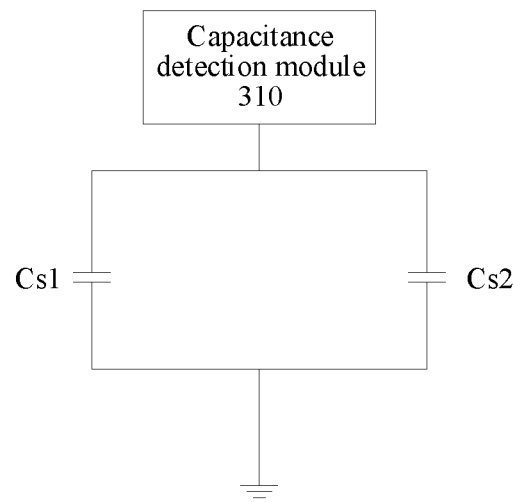
FIG. 10 shows an equivalent circuit diagram of a capacitance detection circuit provided in another embodiment of this application.

At this time, FIG. 7 is equivalent to FIG. 10. That is, the capacitance detection module 310 is connected to the third capacitor set at this time. It can be seen from FIG. 10 that the third capacitor set is a capacitor set formed by the to-be-detected row capacitor element Cs1 and the to-be-detected column capacitor element Cs2 connected in parallel, and the measured third capacitance is a parallel capacitance of the to-be-detected row capacitor element Cs1 and the to-be-detected column capacitor element Cs2. Assuming that the third capacitance is C3, then C3=Cs1+Cs2.

In an implementation, the switching of the first switch K1 and the second switch K2 of the switching module 330 between the first state and the second state can be controlled by the processing module 320. Particularly, the processing module 320 is connected to the switching module 330, and configured to control the switch-on or switch-off of the third contact p13 to or from the first contact p11 and the second contact p12 of the first switch K1 respectively, and the switch-on or switch-off of the third contact p23 to or from the first contact p21 and the second contact p22 of the second switch K2 respectively.

In addition, to facilitate the selection of a to-be-detected capacitor element from the capacitor array 400, and facilitate the sequential detection of each capacitor element in the capacitor array 400, a switch module can be set. As shown in FIG. 6, the capacitance detection module 310 is configured to be connected to the capacitor array 400 through the switch module 340. The processing module 320 is connected to the switch module 340.

The processing module 320 is configured to determine the to-be-detected capacitor element, and control the switch module 340 to connect the capacity detection module 310 to the to-be-detected capacitor element.

In an implementation, the processing module 320 can obtain a preset detection sequence in advance, in which the sequence and identifiers of the capacitor elements to be detected in sequence, and a capacitor element is sequentially determined as the to-be-detected capacitor element according to the preset detection sequence. Particularly, For the setting of the preset detection sequence, reference may be made to the descriptions in the subsequent method embodiments.

Particularly, the switch module 340 may be a multi-channel switch, and each capacitor element in the capacitor array 400 is connected to one contact of the multi-channel switch. For example, the wire in each row and the wire in each column in the capacitor array 400 are connected to one contact of the multi-channel switch, and the capacitance detection module 310 is also connected to one contact of the multi-channel switch. The processing module 320 can control the switch-on or switch off to or from different contacts in the multi-channel switch, to connect the to-be-detected capacitor element to the capacitance detection module 310.

Figure 11:
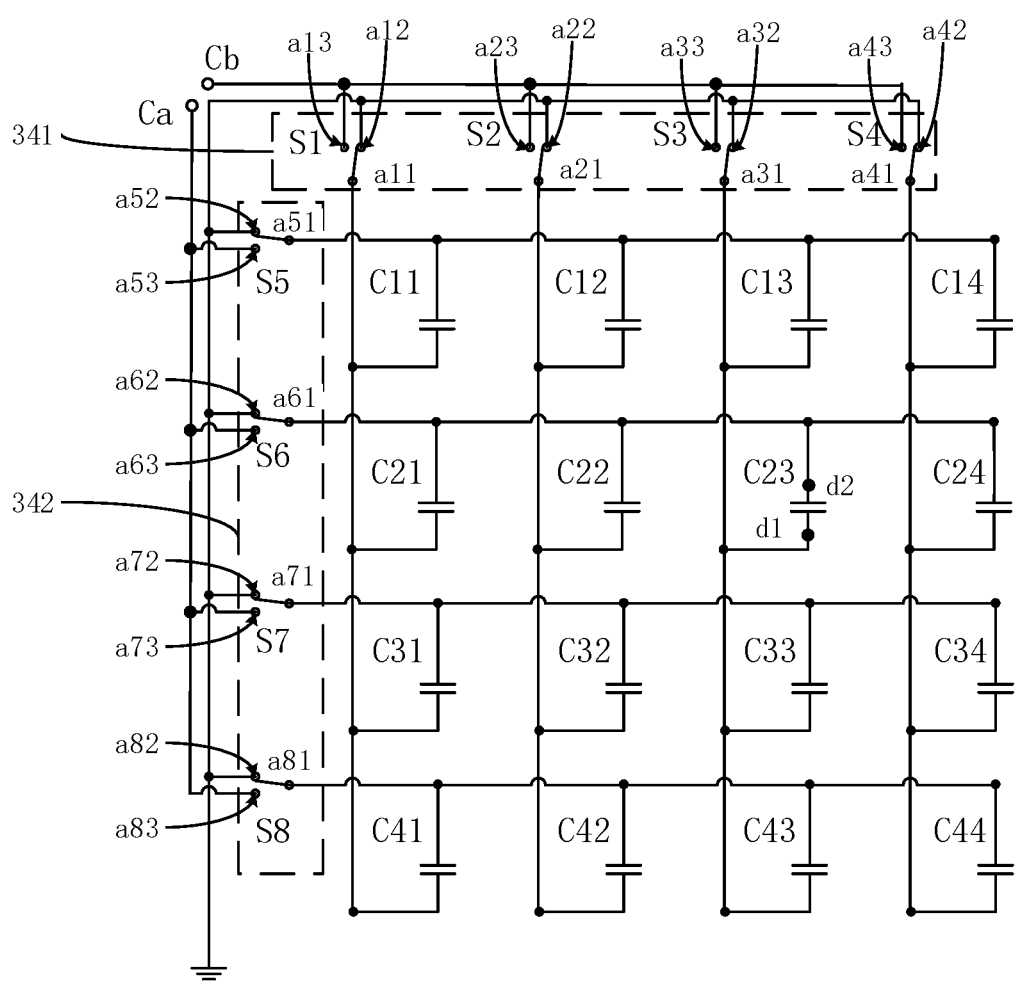
FIG. 11 is a schematic view showing a switch module provided in an embodiment of this application.

In an implementation, as shown in FIG. 11, the switch module 340 includes a column switch set 341 and a row switch set 342. The column switch set 341 includes a plurality of column switches, and the row switch set 342 includes a plurality of row switches. As shown in FIG. 11, when the capacitor array is a 4*4 capacitor array, the plurality of column switches include a first column switch S1, a second column switch S2, a third column switch S3 and a fourth column switch S4, and the plurality of row switches include a first row switch S5, a second row switch S6, a third row switch S7 and a fourth row switch S8. Each capacitor element corresponds to a column switch and a row switch. For example, the row switch corresponding to the capacitor element C23 is S6, and the corresponding column switch is S3. The column switch and row switch corresponding to a capacitor element refer to the column switch and row switch connected to the capacitor element.

In an implementation, the processing module 320 is configured to determine a target row switch and a target column switch corresponding to the to-be-detected capacitor element; and connect the target row switch and the target column switch to the capacitance detection module 310, ground other row switches than the target row switch in the plurality of row switches, and ground other column switches than the target column switch in the plurality of column switches.

Particularly, each row switch and each column switch can be controlled by the processing module 320 to be connected or disconnected to or from the capacitance detection module 310, and connected or disconnected to or from an earthing terminal. For example, if the to-be-detected capacitor element is C23, the target row switch corresponding to the capacitor element C23 is the second row switch S6, and the target column switch corresponding to the capacitor element C23 is the third row switch S3.

The processing module 320 can control the second row switch S6 and the third column switch S3 to be connected to the capacitance detection module 310, and control the row switch S5, the row switch S7, the row switch S8, the column switch S1, the column switch S2 and the column switch S4 to be connected to an earthing terminal. As a result, two terminals of the capacitor elements located in the first row, the third row, the fourth row, the first column, the second column and the fourth column are grounded.

In an implementation, referring to FIG. 11, each of the row switches and each of the column switches include a first connection terminal. The first terminal d1 of each of the capacitor elements is connected to a first connection terminal of one of the column switches, and the second terminal d2 of each of the capacitor elements is connected to a first connection terminal of one of the row switches. As shown in FIG. 11, the first terminals d1 of the capacitors located in the first column are all connected to the first connection terminal a11 of the first column switch S1, the first terminals d1 of the capacitors located in the second column are all connected to the first connection terminal a21 of the second column switch S2, the first terminals d1 of the capacitors located in the third column are all connected to the first connection terminal a31 of the third column switch S3, and the first terminals d1 of the capacitors located in the fourth column are all connected to the first connection terminal a41 of the fourth column switch S4. The second terminal d2 of the capacitors located in the first row are all connected to the first connection terminal a51 of the first row switch S5, the second terminal d2 of the capacitors located in the second row are all connected to the first connection terminal a61 of the second row switch S6, the second terminal d2 of the capacitors located in the third row are all connected to the first connection terminal a71 of the third row switch S7, and the second terminal d2 of the capacitors located in the fourth row are all connected to the first connection terminal a81 of the fourth row switch S8.

In some embodiments, the processing module 320 is further configured to connect the first connection terminal of the target row switch and the first connection terminal of the target column switch to the capacitance detection module 310, ground the first connection terminals of other row switches than the target row switch in the plurality of row switches, and ground the first connection terminals of other column switches than the target column switch in the plurality of column switches.

Particularly, each of the row switches and each of the column switches further include a second connection terminal and a third connection terminal. The second connection terminals of each of the row switches and each of the column switches are grounded, and the third connection terminals of each of the row switches and each of the column switches are connected to the capacitance detection module 310.

As shown in FIG. 11, the switch module 340 further includes a first interface Ca and a second interface Cb, and both the first interface Ca and the second interface Cb are connected to the capacitance detection module 310. The third connection terminal of each of the column switches is connected to the first interface Ca, and the third connection terminal of each of the row switches is connected to the second interface Cb.

As shown in FIG. 11, the third connection terminal a13 of the first column switch S1, the third connection terminal a23 of the second column switch S2, the third connection terminal a33 of the third column switch S3, and the third connection terminal a43 of the fourth column switch S4 are all connected to the first interface Ca. The third connection terminal a53 of the first row switch S5, the third connection terminal a63 of the second row switch S6, the third connection terminal a73 of the third row switch S7 and the third connection terminal a83 of the fourth row switch S8 are all connected to the second interface Cb. The second connection terminal a12 of the first column switch S1, the second connection terminal a22 of the second column switch S2, the second connection terminal a32 of the third column switch S3, the second connection terminal a42 of the fourth column switch S4, the second connection terminal a52 of the first row switch S5, the second connection terminal a62 of the second row switch S6, the second connection terminal a72 of the third row switch S7 and the second connection terminal a82 of the fourth row switch S8 are all grounded.

In a normal state, that is, when the capacitance detection module 310 does not detect the capacitance of the capacitor element in the capacitor array 400, the first connection terminal of each row switch is connected to the second connection terminal, and disconnected from the third connection terminal; and the first connection terminal of each column switch is connected to the second connection terminal, and disconnected from the third connection terminal. That is, each row switch and each column switch maintain a connection state of switching on to the ground terminal.

When the capacitance of a capacitor element in the capacitor array (that is, to-be-detected capacitor element) needs to be detected, the normal state is switched to a detection state. In the detection state, the first connection terminal of a row switch corresponding to the to-be-detected capacitor element is disconnected from the second connection terminal, and connected to the third connection terminal; and the first connection terminal of a column switch corresponding to the to-be-detected capacitor element is disconnected from the second connection terminal, and connected to the third connection terminal.

Particularly, the processing module switches on the first connection terminal to the third connection terminal of the target row switch, and switches off the first connection terminal from the second connection terminal; switches on the first connection terminal to the third connection terminal of the target column switch, and switches off the first connection terminal from the second connection terminal; switches on the first connection terminals to the second connection terminals of other row switches than the target row switch in the plurality of row switches, and switches off the first connection terminals from the third connection terminals; and switches on the first connection terminals to the second connection terminals of other column switches than the target column switch in the plurality of column switches, and switches off the first connection terminals from the third connection terminals.

Figure 12:
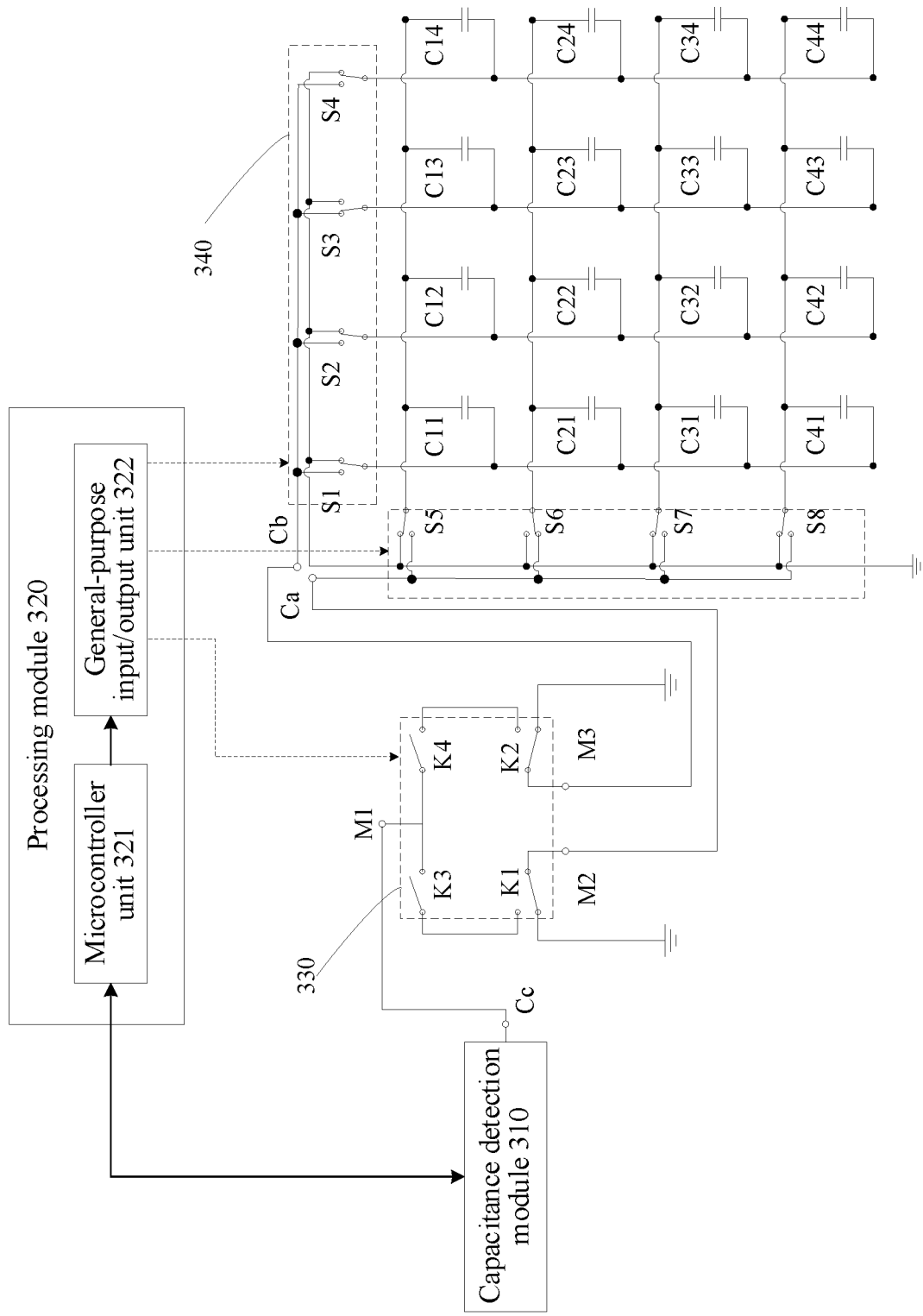
FIG. 12 is a schematic view showing a capacitance detection circuit provided in another embodiment of this application.

Assuming that the to-be-detected capacitor element is C23, the target row switch corresponding to the capacitor element C23 is the second row switch S6, and the target column switch corresponding to the capacitor element C23 is the third column switch S3. As shown in FIG. 12, the processing module 320 switches on the first connection terminal a61 to the third connection terminal a63 of the second row switch S6, and switches off the first connection terminal a61 from the second connection terminal a62; and switches on the first connection terminal a31 to the third connection terminal a33 of the third column switch S3, and switches off the first connection terminal a31 from the second connection terminal a32, so that the first terminal d1 of the capacitor element C23 is connected to the first interface Ca, and the second terminal d2 of the capacitor element C23 is connected to the second interface Cb.

Particularly, FIG. 12 shows a capacitance detection circuit provided in another embodiment of this application. As shown in FIG. 12, the processing module 320 includes a microcontroller unit 321 and a general-purpose input/output unit 322. As shown in FIG. 12, the black arrow represents the communication line, and the black dotted line connected from the general-purpose input/output unit 322 represents the control line and the direction of control.

The capacitor array is an array sensor of capacitors of various materials and sizes. As shown in FIG. 4, FIG. 11 and FIG. 12, the capacitor array 400 is arranged into a rectangular array. For example, in a 4*4 array of 16 capacitor elements, the upper electrode plates (i.e. the second terminals d2) of each capacitor element are connected horizontally, and the lower electrode plates (i.e. the first terminals d1) are connected vertically. A total of eight row and column lead wires are drawn out and then connected to a controllable switch switching circuit (that is, switch module 340). The controllable switch can be a controllable single pole double throw (SPDT) switch or any controllable no polarity switch. The switching of the controllable switch can be controlled by the microcontroller unit 321 by controlling the level outputted by the input/output unit 322.

The microcontroller unit 321 is used as a core processor of signal acquisition and processing in the capacitance detection circuit. After deploying a peripheral circuit and the general-purpose input/output unit 322, the general-purpose input/output unit 322 controls the switching of each switch in the switching module and the switch module.

The microcontroller unit 321 is connected to the capacitance detection module 310, and configured to acquire the first capacitance, the second capacitance and the third capacitance detected by the capacity detection module 310, and obtain the capacitance of the to-be-detected capacitor element according to the first capacitance, the second capacitance and the third capacitance.

The microcontroller unit 321 may be a microprogrammed control unit (MCU), and the general-purpose input/output unit 322 may be a general purpose input/output (GPIO) unit.

As shown in FIG. 12, the capacitance detection module 310 includes a third interface Cc, and the switching module 330 includes a fourth interface M1, a fifth interface M2 and a sixth interface M3. The fourth interface M1 is connected to the third interface Cc, the fifth interface M2 is connected to the first interface Ca, and the sixth interface M3 is connected to the second interface Cb. Further, the switching module 330 includes, in addition to the first switch K1 and the second switch K2, a third switch K3 and a fourth switch K4. The fourth interface M1 is connected to the first contact p11 of the first switch K1 through the third switch K3, and the fourth interface M1 is connected to the first contact p21 of the second switch K2 through the fourth switch K4.

In an implementation, the first switch K1, the second switch K2, the third switch K3, the fourth switch K4 and each row switch and column switch in the switch module 340 are controlled by the microcontroller unit 321 through the input/output unit 322.

Particularly, a specific process of detecting the capacitance of a to-be-detected capacitor element is described by way of example in which the to-be-detected capacitor element is C23.

The first column switch S1, the second column switch S2, the third column switch S3, the fourth column switch S4, the first row switch S5, the second row switch S6, the third row switch S7 and the fourth row switch S8 are controlled by the microcontroller unit 321 to switch to a state as shown in FIG. 12. That is, the first connection terminal a61 is connected to the third connection terminal a63 of the second row switch S6, and the first connection terminal a61 is disconnected from the second connection terminal a62. That is to say, the first connection terminal a61 is switched on to the third connection terminal a63 of the second row switch S6. The first connection terminal a31 is connected to the third connection terminal a33 of the third column switch S3, and the first connection terminal a31 is disconnected from the second connection terminal a32. That is to say, the first connection terminal a31 is switched on to the third connection terminal a33 of the third column switch S3.

Moreover, the first connection terminal a51 is kept connected to the second connection terminal a52 of the first row switch S5, the first connection terminal a71 is kept connected to the second connection terminal a72 of the third row switch S7, the first connection terminal a81 is kept connected to the second connection terminal a82 of the fourth row switch S8, the first connection terminal a11 is kept connected to the second connection terminal a12 of the first column switch S1, the first connection terminal a21 is kept connected to the second connection terminal a22 of the second column switch S2, and the first connection terminal a41 is kept connected to the second connection terminal a42 of the fourth column switch S4.

Figure 13:
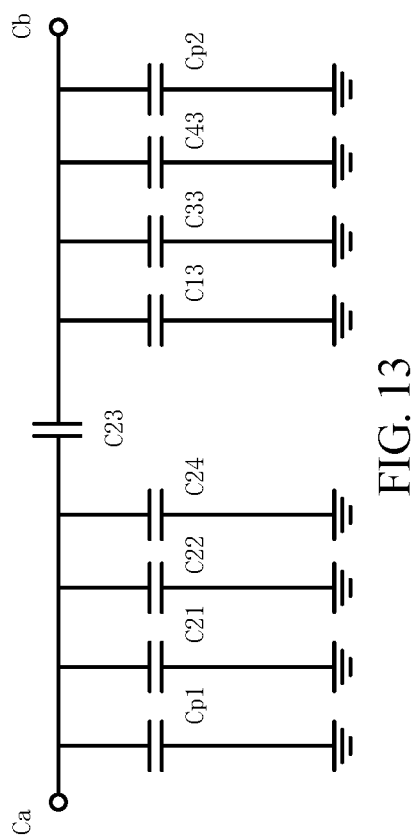
FIG. 13 shows an equivalent circuit diagram of a capacitor array provided in an embodiment of this application.
Figure 14:
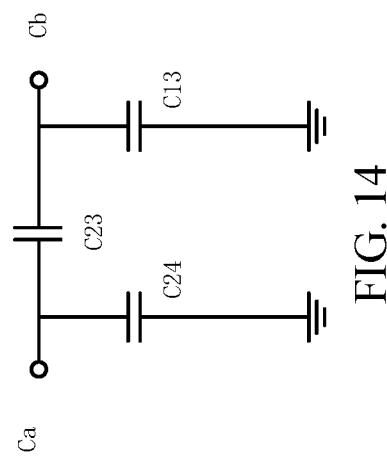
FIG. 14 shows an equivalent circuit diagram of a capacitor array provided in an embodiment of this application shown in FIG. 13.

Assuming that the wire to the first interface Ca is a Ca lead wire and the wire to the second interface Cb is a Cb lead wire, then two terminals of C23 are connected to the Ca lead wire and Cb lead wire. Other lead wires than the row and column wires to C23 are grounded. At this time, an equivalent circuit of the capacitor array is as shown in FIG. 13. That is, the capacitors in the same row and the same column with C23 are equivalent to bypass capacitors of the Ca lead and the Cb lead, and the capacitors that are not in the same row and the same column therewith are short-circuited to earth and become ineffective because the upper and lower electrode plates are grounded. Cp1 and Cp2 are equivalent parasitic capacitors between the Ca and Cb lead and the ground terminal, respectively. After the simplification, and the addition and combination of parallel capacitors, a final equivalent circuit diagram for the measurement of a capacitor array is shown in FIG. 14. As shown in FIG. 14, Ct is the capacitor element C23 currently to be detected, and Cs1 and Cs2 are the sum of equivalent capacitance of the bypass capacitors at two sides of C23. Specifically, Cs1 is the sum of the capacitance of Cp1, C21, C22 and C24. A capacitor set after Cp1 is connected in parallel with C21, C22 and C24 can be used as the to-be-detected row capacitor element, that is, Cs1 can be regarded as the capacitance of the to-be-detected row capacitor element. Cs2 is the sum of the capacitance of Cp2, C13, C33, and C43. A capacitor set after Cp2 is connected in parallel with C13, C33, and C43 can be used as the to-be-detected column capacitor element, that is, Cs2 can be regarded as the capacitance of the to-be-detected column capacitor element.

As can be seen from FIG. 14, Cs1 and Cs2 are the origin of the crosstalk problem during capacitance detection. Therefore, if the influence of Cs1 and Cs2 can be calculated and compensated during the detection of Ct, the crosstalk compensation for the units in a capacitor array can be realized.

Figure 15:
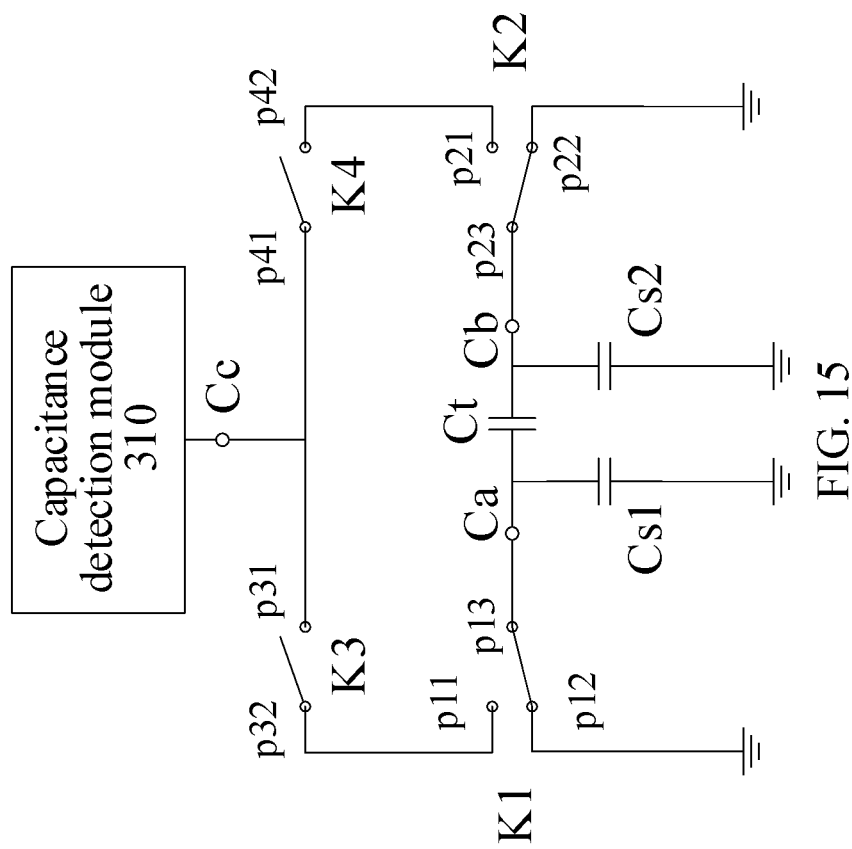
FIG. 15 is a schematic view showing the connection between a capacitance detection module, a switching module, and a to-be-detected capacitor element provided in another embodiment of this application.

Referring to FIG. 14 and FIG. 12, the connection between the capacitance detection module 310, the switching module 330 and the to-be-detected capacitor element can also be schematically shown in FIG. 15. The first switch K1 and the second switch K2 can be controllable SPDT switches, and the third switch K3 and the fourth switch K4 can be controllable contact switches.

The specific capacitance detection process is as follows:

Step (1): The microcontroller unit 321 controls the first switch K1, the second switch K2, the third switch K3 and the fourth switch K4, to connect p31 to p32, p11 to p13, and p23 to p22, and disconnect p41 from p42, p12 from p13, and p23 from p21. At this time, FIG. 15 is equivalent to FIG. 8. The current capacitance is detected and read by the capacitance detection module 310 and recorded as C1, where C1=Ct+Cs1. If no crosstalk compensation is provided in the circuit, the capacitance C1 read at this time is used as the capacitance of the point Ct. Cs1 is the sum of the capacitance of other capacitances in the row (or column) where the capacitor of this point is located, which is generally far larger than the real Ct. Therefore, if no crosstalk compensation is provided, the real capacitance (Ct) of the capacitor element will be completely submerged in the detected capacitance (C1), thus greatly reducing the sensitivity of the sensor.

Step (2): The microcontroller unit 321 turns on p41 to p42, p12 to p13, and p23 to p21, and disconnect p31 from p32, p11 from p13, and p23 from p22. At this time, FIG. 15 is equivalent to FIG. 9. The current capacitance is detected and read by the capacitance detection module 310, and recorded as C2, where C2=Ct+Cs2.

Step (3): The microcontroller unit 321 turns on p41 to p42, p11 to p13, p23 to p21, and p41 to p42, and turns off p12 from p13 and p23 from p22. At this time, FIG. 15 is equivalent to FIG. 10. The current capacitance is detected and read by the capacitance detection module 310, and recorded as C3, where C3=Cs1+Cs2.

The values of C1, C2, and C3 is read into the microcontroller unit 321, and decoupled to remove the crosstalk, and then Ct is calculated by the formula Ct=(C1+C2−C3)/2. At this time, the phenomenon that the capacitance of the capacitor elements interacts with each other caused by the crosstalk of the capacitor array is eliminated.

Then, the capacitance detection of a capacitor element in the capacitor array is completed. For the detection of all capacitor elements in the entire capacitor array, the processing module can determine a capacitor element following the aforementioned to-be-detected capacitor element as a new to-be-detected capacitor element according to a preset detection sequence, and inform the capacitance detection module of the to-be-detected capacitor element. The capacitance detection module implements the operation of detecting the first capacitance, the second capacitance and the third capacitance and subsequent operations, until all capacitor elements that require the detection of capacitance are detected according to the preset detection sequence. For example, the microcontroller unit 321 controls, by scanning, the row switch or column switch of the capacitor array to sequentially switch to connect the upper and lower electrode plates of each capacitor element in the capacitor array to the Ca and Cb leads. When each capacitor element is connected, the controllable switch in the switching module is controlled by the microcontroller unit 321, then the capacitance of each capacitor element in three switch states, that is, the first capacitance, the second capacitance and the third capacitance, are sequentially detected by the capacitance detection module, and finally, the real capacitance of each capacitor element is calculated after decoupling. After all the capacitors in the capacitor array are scanned and tested and their respective capacitance are calculated, the capacitance measurement and crosstalk compensation of the entire array are completed.

Figure 16:
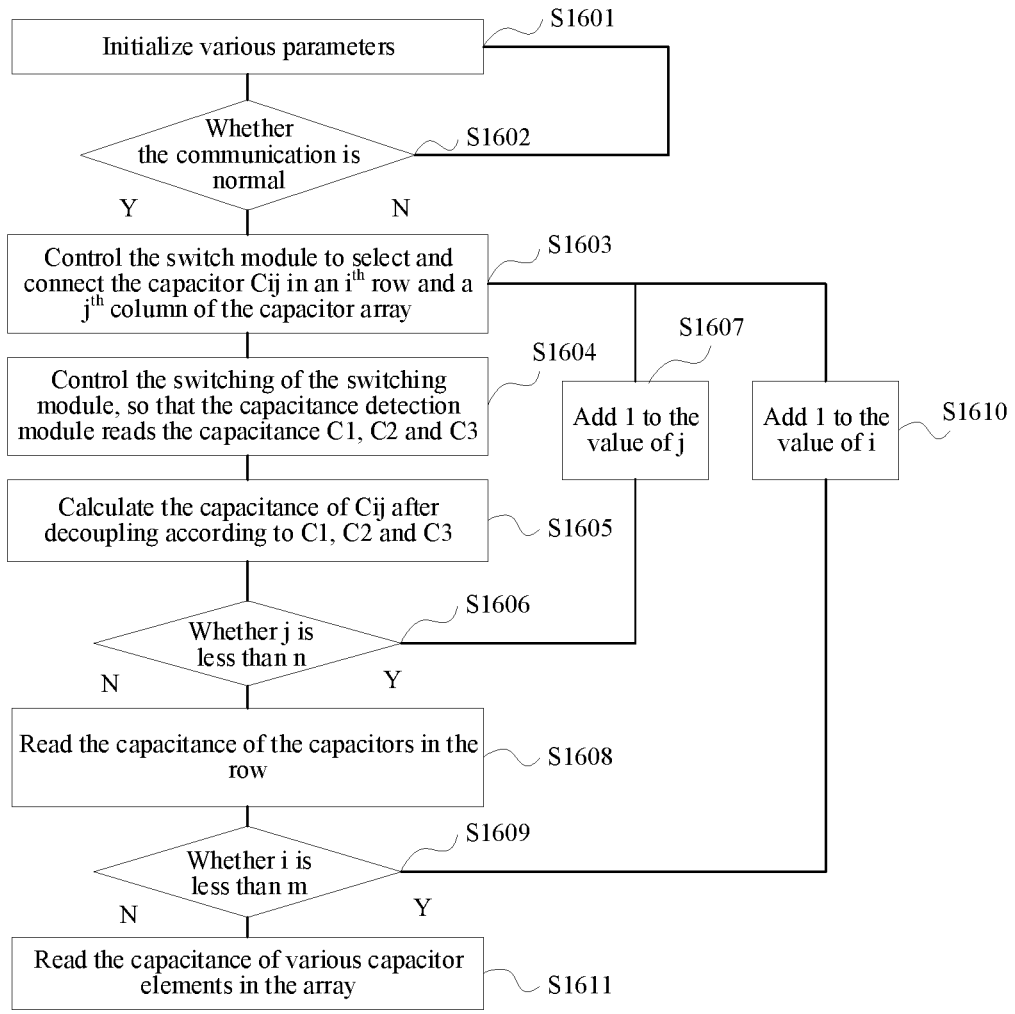
FIG. 16 shows a flow chart of a scanning method provided in an embodiment of this application.

The specific scanning method is shown in FIG. 16. Specifically, the method includes Steps S1601 to S1611.

Step S1601: Initialize various parameters.

The various parameters include a parameter i, a parameter j, a parameter m and a parameter n. In an implementation, n represents the number of columns of the capacitor array, and m represents the number of rows of the capacitor array. That is, the capacitor array has a matrix distribution of m*n. For example, for a 4*4 capacitor array, both m and n are 4.

Cij represents a capacitor element in an i-th row and a $j^{th}$ column, the parameter i represents the row number of the currently detected capacitor element, and the parameter j represents the column number of the currently detected capacitor element. During initialization, the parameter i and the parameter j are set to an initial value, for example, the initial value is 1.

The implementation of initializing various parameters may be to initialize the above-mentioned various parameters, and the parameters of the serial interfaces between the microcontroller unit 321 and other modules, to establish a communication connection.

Step S1602: Determine whether the communication is normal.

In an implementation, the communication between the microcontroller unit 321 and the capacitance detection module 310, and between the microcontroller unit 321 and the general-purpose input/output unit 322 is determined. Particularly, the microcontroller unit 321 transmits a test signal to the capacitance detection module 310 and the general-purpose input/output unit 322, and determines whether a confirmation signal is received from the capacitance detection module 310 and the general-purpose input/output unit 322. If so, the communication is determined to be normal.

In another implementation, whether the communication between the microcontroller unit 321 and an upper computer is normal is determined. Particularly, a user checks the detection results through the upper computer and transmits an instruction to the capacitance detection circuit, to control the capacitance detection circuit to perform specific operations. The microcontroller unit 321 and the upper computer are connected through a serial interface. The microcontroller unit 321 transmits a test signal to the upper computer, and the upper computer transmits a confirmation signal after successfully receiving the test signal. Therefore, the microcontroller unit 321 can determine that the communication is normal after successfully receiving the confirmation signal.

If the communication is not normal, Step S1601 is performed again to re-initialize various parameters.

Step S1603: Control the switch module to select and connect the capacitor Cij in an $i^{th}$ row and a $j^{th}$ column of the capacitor array.

For example, if the currently to-be-detected capacitor element is C23, the switch module is controlled to select and connect the capacitor in the second row and the third column.

Step S1604: Control the switching of the switching module so that the capacitance detection module reads the capacitance C1, C2 and C3.

Step S1605: Calculate the capacitance of Cij after decoupling according to C1, C2 and C3.

The implementations of Step S1604 and Step S1605 can be made reference to the foregoing embodiments, and will not be repeated here again.

Step S1606: Determine whether j is less than n. If j is less than n, Step S1607 is performed.

Step S1607: Add 1 to the value of the parameter j.

In an implementation, the detection sequence is line-by-line scan. Taking the capacitor elements shown in FIG. 11 as an example, the first row is scanned firstly, that is, each capacitor element in the first row is detected sequentially according to the column order, then the second row is scanned, that is, each capacitor element in the second row is detected sequentially according to the column order, until all the capacitor elements are detected.

Whether j is less than n is determined. If j is less than n, it means that the capacitance of the capacitor elements in the current i-th row has not been completely detected. Step S1607 is performed, that is, the operation of j++ is performed to increase the value of the parameter j by 1. An adjacent capacitor element that is in the same row with the to-be-detected capacitor element C23 and follows the C23 is further detected. At this time, the to-be-detected capacitor element is C24. Step S1603 is performed again to detect the newly to-be-detected capacitor element.

If j is not less than n, that is, j is greater than or equal to n, it means that the capacitance of all capacitor elements in the row have been read, and then Step S1608 is performed.

Step S1608: Read the capacitance of the capacitors in the row.

In an implementation, the microcontroller unit 321 reads the capacitance of each capacitor element in the row where the currently detected capacitor element is located. For example, the capacitance of each capacitor element (C21, C22, C23, C24) in the second row is read.

In an implementation, when Step S1608 is executed, j will also be initialized, that is, initialized to 1, so as to continue to read a capacitor element in the first column of the next row.

Step S1609: Determine whether i is less than m. If i is less than m, Step S1610 is performed.

Step S1610: Add 1 to the value of the parameter i.

Whether i is less than m is determined. If i is less than m, it means that the capacitor elements have not been completely detected. That is, the capacitor elements corresponding to each row following row i have not been detected. Step S1610 is performed, and the operation of i++ is performed to increase the value of the parameter i by 1. Therefore, the capacitance of the capacitor elements in the next row is started to be detected. For example, the currently detected capacitor element is C24, that is, the parameter i is 2, the parameter j is 4, and the parameter j is equal to n. Step S1608 is performed to read the capacitance of the capacitor elements, that is, C21, C22, C23, and C24, in the second row. Then, since i is less than m, i is increased by 1, and the newly to-be-detected capacitor element becomes C31. Step S1603 is performed again, to detect the newly to-be-detected capacitor element.

Step S1611: Read the capacitance of each capacitor element in the array.

Then, when j is greater than or equal to n, and i is also greater than or equal to m, it is determined that the capacitance of all capacitor elements is detected, and the capacitance of each capacitor element in the array is read.

Therefore, in an embodiment of this application, the microcontroller unit 321 is used as a core processor of signal acquisition and processing in the capacitance detection circuit. After deploying a peripheral circuit and the general-purpose input/output unit 322, the general-purpose input/output unit 322 controls the switching of each switch in the switching module and the switch module. According to the preset detection sequence, the capacitance of each capacitor element in the capacitor array is obtained sequentially, so as to obtain the capacitance of each capacitor element quickly, efficiently and accurately, and avoid the phenomenon of crosstalk.

Figure 17:
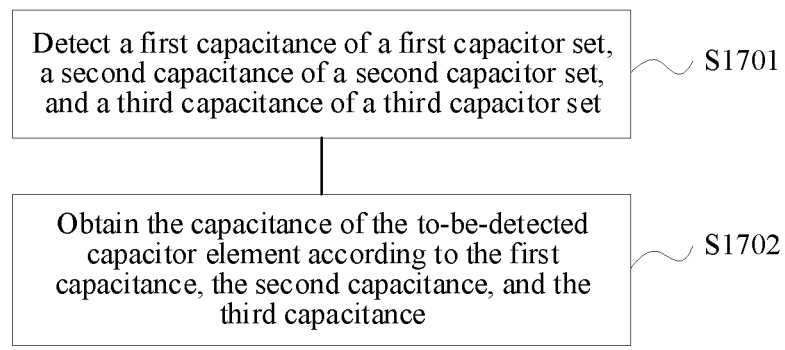
FIG. 17 shows a flow chart of a capacitance detection method provided in an embodiment of this application.

FIG. 17 shows a capacitance detection method, applicable to the above-mentioned capacitor array. An execution entity of the method can be the capacitance detection circuit as described above. In an implementation, the execution body may be a processing module. Particularly, the method includes Step S1701 to Step S1702.

Step S1701: Detect a first capacitance of a first capacitor set, a second capacitance of a second capacitor set and a third capacitance of a third capacitor set.

The first capacitor set comprises a to-be-detected capacitor element and a to-be-detected row capacitor element, the second capacitor set comprises the to-be-detected capacitor element and a to-be-detected column capacitor element, and the third capacitor set comprises the to-be-detected row capacitor element and the to-be-detected column capacitor element. The to-be-detected capacitor element is a capacitor element in the capacitor array, the to-be-detected row capacitor element is a capacitor element in the same row with the to-be-detected capacitor element, and the to-be-detected column capacitor element is a capacitor element in the same column with the to-be-detected capacitor element.

Step S1702: Obtain the capacitance of the to-be-detected capacitor element according to the first capacitance, the second capacitance and the third capacitance.

Particularly, implementations of the method can be made reference to the foregoing embodiments of capacitance detection circuit, and will not be repeated here again.

Figure 18:
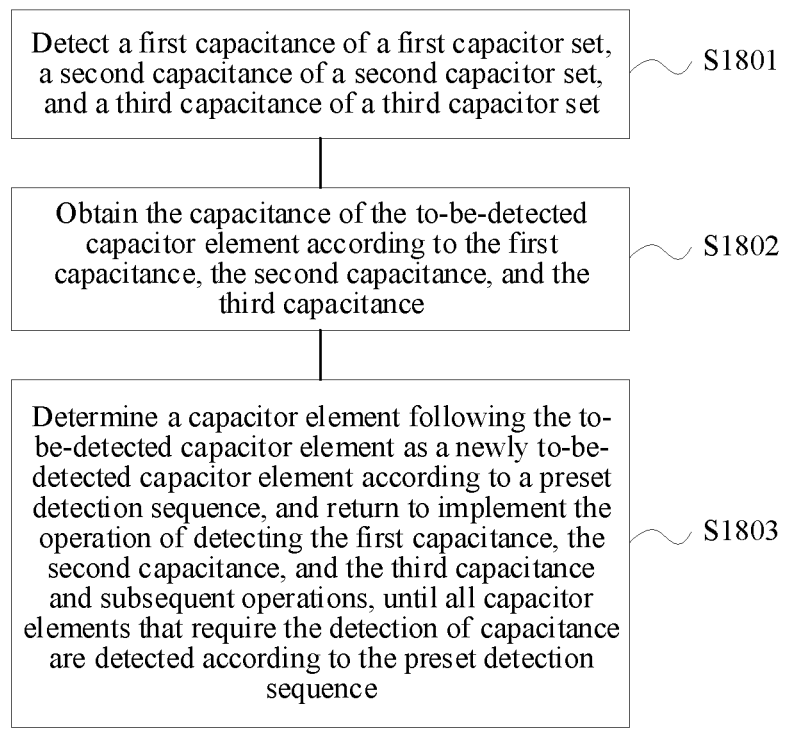
FIG. 18 shows another flow chart of a capacitance detection method provided in another embodiment of this application.

FIG. 18 shows a capacitance detection method, applicable to the above-mentioned capacitor array. An execution body of the method can be the capacitance detection circuit as described above. In an implementation, the execution body may be a processing module. Particularly, the method includes Step S1801 to Step S1803.

Step S1801: Detect a first capacitance of a first capacitor set, a second capacitance of a second capacitor set and a third capacitance of a third capacitor set.

Step S1802: Obtain the capacitance of a to-be-detected capacitor element according to the first capacitance, the second capacitance and the third capacitance.

Step S1803: Determine a capacitor element following the to-be-detected capacitor element as a newly to-be-detected capacitor element according to a preset detection sequence, and implements the operation of detecting the first capacitance, the second capacitance and the third capacitance and subsequent operations again, until all capacitor elements that require the detection of capacitance are detected according to the preset detection sequence.

The preset detection sequence may be line-by-line scan corresponding to the scanning method shown in FIG. 16. For example, for a 4*4 capacitor array, the determined preset detection sequence is to sequentially detect C11, C12, C13, C14, C21, C22, C23, C24, C31, C32, C33, C34, C41, C42, C43, and C44. Therefore, if the currently to-be-detected capacitor element is C23, then a capacitor element following the to-be-detected capacitor element is C24.

Particularly, the specific implementation of Step S1803 can be made reference to Step S1603 to Step S1611 described above, which will not be repeated here.

The capacitance detection circuit and method provided in the embodiments of this application can solve the problem of crosstalk when used to detect a capacitor array. During the detection of capacitor elements in the array, the influence of crosstalk between various units in the array is compensated, and also the influence of the parasitic capacitance caused by the lead wires during the detection of the capacitor array is avoided, so that accurate sensing of the change in capacitance of each capacitor element in the capacitor array is realized.

Figure 19:
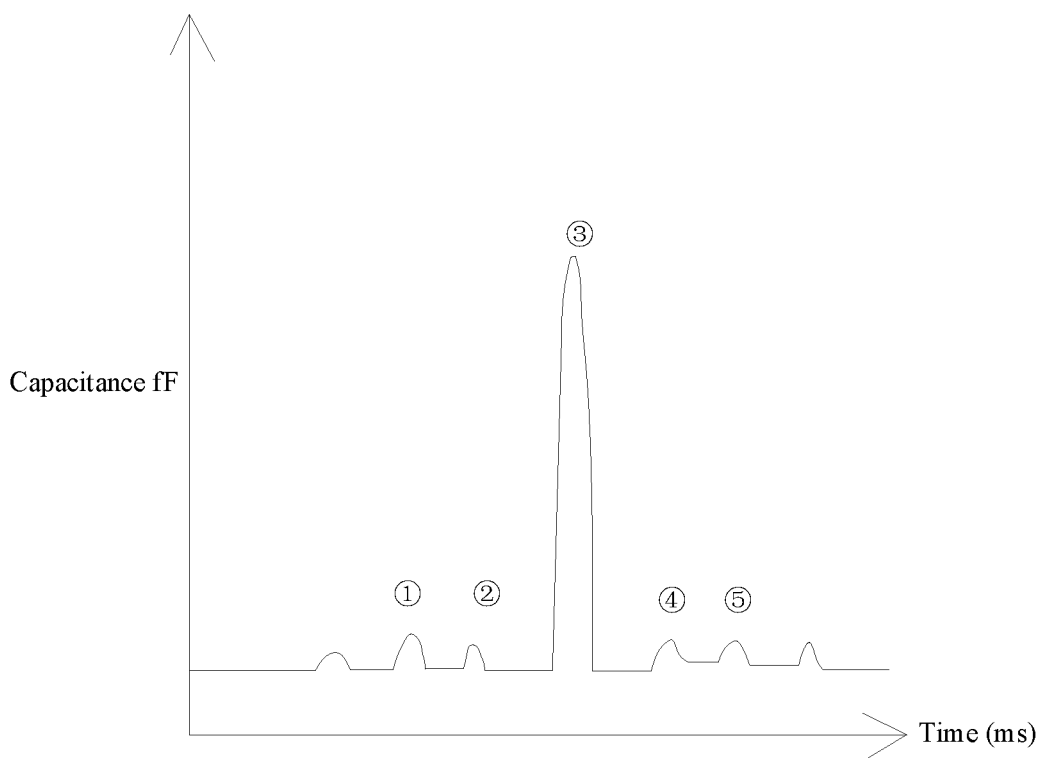
FIG. 19 is a waveform diagram showing the capacitance detection results provided in an embodiment of this application.

Particularly, as shown in FIG. 19, it can be seen from the comparison with FIG. 2 that when capacitor elements around the to-be-detected capacitor element is pressed, the change in capacitance of the to-be-detected capacitor element caused by the surrounding capacitor elements is very little. That is, compared with FIG. 2, the size of the peaks is significantly smaller in the waveforms of ①②④ and ⑤. It can be seen that the crosstalk rate caused by the capacitor elements surrounding the to-be-detected capacitor element to the to-be-detected capacitor element is below 10%.

Figure 20:
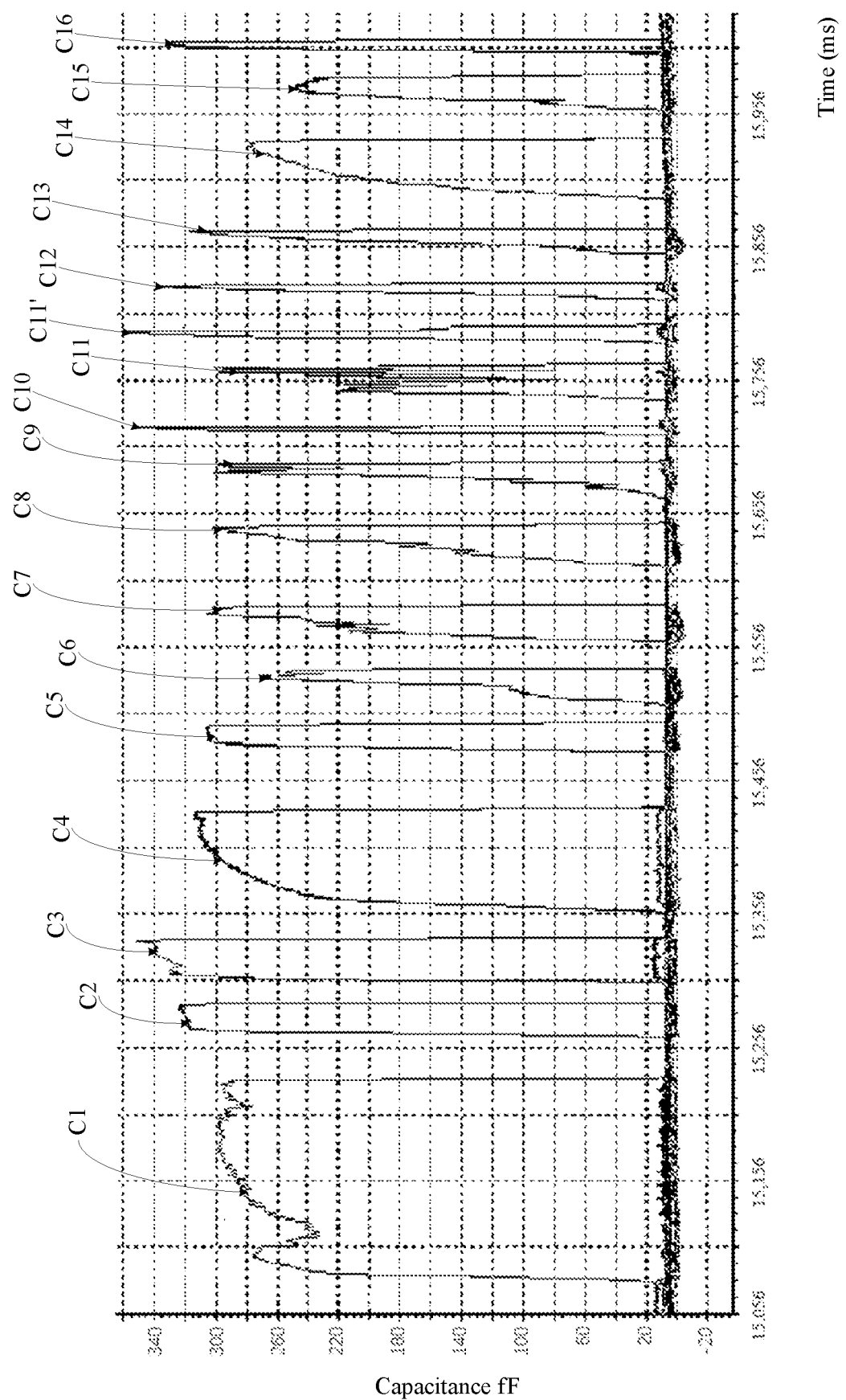
FIG. 20 is a waveform diagram showing the capacitance detection results provided in another embodiment of this application.

FIG. 20 is a curve showing the capacitance detection results of a capacitor array in 4*4 matrix. With the same pressing parameters, each capacitor element is pressed in a direction perpendicular to the capacitor element, and the capacitance of each capacitor element is detected. In FIG. 20, the horizontal axis is time, in millisecond, and the vertical axis is the capacitance, in fF. The capacitance of each capacitor element is collected following the sampling time, and fitted into a curve to obtain the various waveform curves in FIG. 20. Each waveform curve corresponds to a capacitor element. In FIG. 20, the name of each capacitor element is indicated next to each curve. C11 and C11' are the same capacitor element, and are tested twice.

As can be seen from FIG. 20, when each capacitor element is pressed with the same pressing parameters in a direction perpendicular to the capacitor element, the capacitance of each capacitor element differs slightly, and the crosstalk rate is below 3%.

Figure 21:
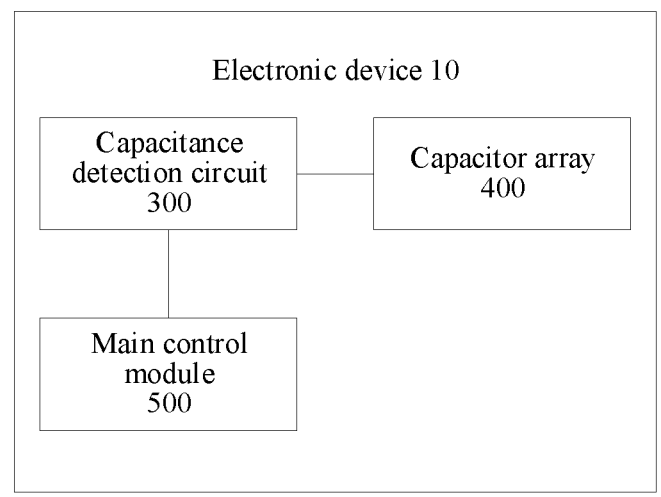
FIG. 21 is a block diagram showing modules in an electronic device provided in an embodiment of this application.

FIG. 21 is a block diagram showing the structure of an electronic device provided in an embodiment of this application. The electronic device 10 may be a smart phone, a tablet computer, an e-book and other devices capable of running application programs, or an intelligent robot. In an embodiment of this application, the electronic device is an intelligent robot. The electronic device 10 in an embodiment of this application may include: a capacity detection circuit 300 and a capacity detection circuit 400.

The intelligent robot is a mechanical device that performs work automatically. It can be amenable to human's command, run pre-stored programs, or act according to principles and guides formulated with artificial intelligence technology. The task is to assist in or replace all or part of human work, for example, in production, construction, or dangerous work. For example, the robot may include industrial robots such as robotic arms, and special robots, etc.

The so-called industrial robot is a multi-joint manipulator or a multi-degree-of-freedom robot for the industrial field. In addition to industrial robots, the special robots are various advanced robots that are used in non-manufacturing industries and serve humanity, including: service robots, underwater robots, robots for entertainment, military robots, agricultural robots, robotic machines, etc. Among the special robots, some branches develop rapidly and have the tendency to become independent systems, such as service robots, underwater robots, military robots, and micro-operation robots, etc.

Figure 22:
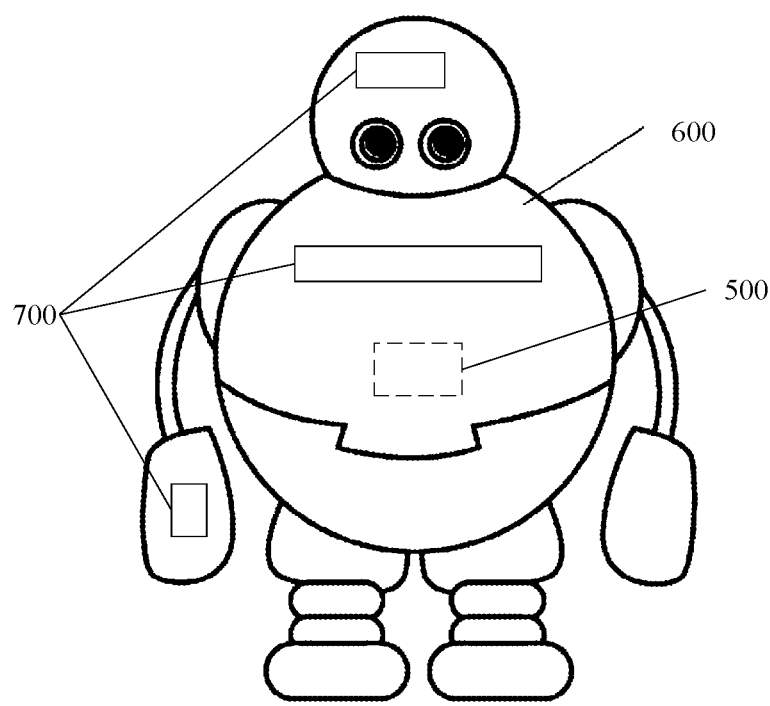
FIG. 22 is a schematic view showing an application scenario of an electronic skin provided in an embodiment of this application.

In an implementation, as shown in FIG. 22, the electronic device includes a housing 600. An electronic skin 700 is provided on the housing 600, and the electronic skin 700 is correspondingly provided with a capacitor array 400 (not shown in FIG. 22). Electronic skin, a new type of wearable flexible bionic tactile sensor, is a device that enables a robot to have tactility. It is to be understood that both the capacitance detection circuit 300 and the capacitance detection method mentioned above can be used for the detection of an electronic skin.

In an implementation, the capacitor array 400 is of a flexible material, that is, each capacitor element and the switch module are of flexible materials and are arranged on a flexible circuit board. The flexible capacitor array is directly fabricated on a substrate of a flexible film material, and a flexible ionic sensing active material is used as a dielectric layer to realize the flexibility, high sensing density, and high sensing sensitivity of the electronic skin. The electronic skin 700 can be located on the surface of the housing at multiple portions of the body of the intelligent robot, such as the head, chest, and limbs. For example, the electronic skin 700 can be located at the hands or soles of the intelligent robot.

The electronic device 10 further includes a main control module 500. The main control module 500 is configured to acquire the capacitance of at least one capacitor element in the capacitor array detected by the capacity detection circuit 300, and control the intelligent robot to perform a predetermined action according to the capacitance. Particularly, the main control module 500 is connected to the capacitance detection circuit 300, and the main control module 500 is connected to the processing module 320. The main control module 500 is configured to acquire the capacitance of at least one capacitor element in the capacitor array detected by the capacity detection circuit 300, and control the intelligent robot to perform a predetermined action according to the capacitance.

In an implementation, the electronic skin 700 can be attached to a manipulator of the intelligent robot. Specifically, the electronic skin 700 can be attached to a finger of the manipulator. When the finger of the manipulator is in contact with a target object, the capacitance detection circuit collects the changes in capacitance of the capacitor elements in each capacitor array on the finger, and the main control module obtains the changes in capacitance, to determine the size, shape, weight, material and other parameters of the target object, and then further determine the gesture of grasping the target object and the strength of grasping the target object. In an implementation, the electronic skin 700 can be attached to the fingertip and knuckle of a finger, the palm or the whole hand.

In another implementation, when a user shakes hands with the intelligent robot, the user's hand is in contact with the capacitor array at the fingers or in the palm of the manipulator of the intelligent robot. The capacitance detection circuit can detect the changes in capacitance of each capacitor element when the user's hand presses the capacitor array, and detect that the user is shaking hands with the intelligent robot, and then control the intelligent robot to perform a predetermined operation. In an implementation, the predetermined operation can be that the intelligent robot gives a designated voice or makes a designated facial expression, for example, a voice of "hello" and an expression with a smile on the face.

The main control module 500 may be a processor of the electronic device, and the processor may include one or more processing cores. The processor is connected to various parts of the entire electronic device 10 by using various interfaces and lines, and implements various functions of the electronic device 10 and processes data by running or executing the instructions, programs, code sets or instruction sets stored in the memory, and calling the data stored in the memory. In an embodiment, the processor may be implemented in at least one hardware form of a digital signal processor (DSP), a field-programmable gate array (FPGA), or a programmable logic array (PLA). The processor may integrate one of a central processing unit (CPU), a graphics processing unit (GPU), and a modem, or a combination thereof. CPU mainly deals with the operating system, user interface and application programs, etc.; GPU is used for rendering and drawing the displayed content; and the modem is used for wireless communication. It is to be understood that the modem described above can also be realized by a single communication chip without being integrated into the processor.

In addition, the electronic device 10 may further include a memory, including a random access memory (RAM), or a read-only memory. The memory can be used to store instructions, programs, code, code sets, or instruction sets. The memory can include a program storage region and a data storage region. The program storage region stores instructions for implementing an operating system, instructions for implementing at least one function (such as a touch function, a sound playback function, and an image playback function), and instructions for implementing the various method embodiments described below.

In an implementation, the program code corresponding to the capacitance detection method can be stored in the memory, and the program code can be called and executed by the processing module 320 to implement the capacitance detection method.

Figure 23:
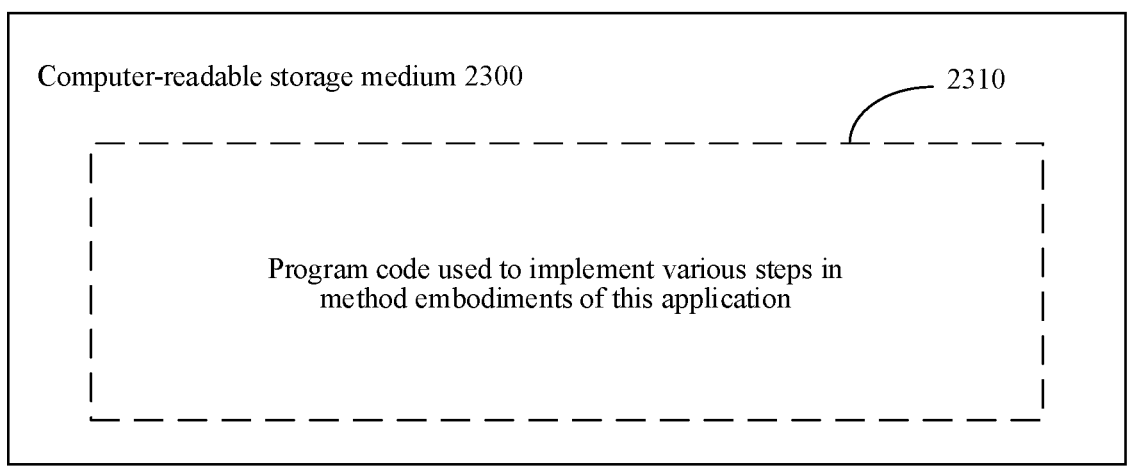
FIG. 23 shows a storage unit for storing or carrying a program code for implementing a capacitance detection method provided in an embodiment of this application.

FIG. 23 is a block diagram showing the structure of a computer-readable storage medium provided in an embodiment of this application. The computer-readable medium 2300 stores a program code, and the program code can be burned into the capacitance detection circuit. Specifically, the program code can be burned into the MCU of the capacitance detection circuit, so that the MCU can run the program code to realize the above-mentioned capacitance detection method.

The computer-readable storage medium 2300 may be an electronic memory such as a flash memory, an electrically erasable programmable read-only memory (EEPROM), an EPROM, a hard disk, or a ROM. In an embodiment, the computer-readable storage medium 2300 includes a non-transitory computer-readable storage medium. The computer-readable storage medium 2300 has storage space for program code 2310 to implement any step of the above-described methods. The program code may be read from one or more computer program products or be written to the one or more computer program products. The program code 2310 may be compressed in an appropriate form.

Finally, the foregoing embodiments are merely used for describing the technical solutions of this application, but are not intended to limit this application. Although this application is described in detail with reference to the foregoing embodiments, a person of ordinary skill in the art is to understand that, modifications may still be made to the technical solutions in the foregoing embodiments, or equivalent replacements may be made to some technical features; and these modifications or replacements will not cause the essence of corresponding technical solutions to depart from the spirit and the scope of the technical solutions in the embodiments of this application. In this application, the term "unit" or "module" in this application refers to a computer program or part of the computer program that has a predefined function and works together with other related parts to achieve a predefined goal and may be all or partially implemented by using software, hardware (e.g., processing circuitry and/or memory configured to perform the predefined functions), or a combination thereof. Each unit or module can be implemented using one or more processors (or processors and memory). Likewise, a processor (or processors and memory) can be used to implement one or more modules or units. Moreover, each module or unit can be part of an overall module that includes the functionalities of the module or unit.

What is claimed is:

1. A circuit for detecting capacitance of a capacitor element within a capacitor array, the circuit comprising:
    a capacitance detection module, configured to detect a first capacitance of a first capacitor set, a second capacitance of a second capacitor set, and a third capacitance of a third capacitor set, the first capacitor set comprising the capacitor element and a row capacitor element in a same row of the capacitor array as the capacitor element, the second capacitor set comprising the capacitor element and a column capacitor element in a same column of the capacitor array as the capacitor element, the third capacitor set comprising the row capacitor element and the column capacitor element; and
    a processing module, configured to obtain the capacitance of the capacitor element according to the first capacitance, the second capacitance and the third capacitance by:
    determining the capacitance of the capacitor element by the formula:

$C_t=(C_1+C_2-C_3)/2$, wherein $C_t$ is the capacitance of the capacitor element, $C_1$ is the first capacitance, $C_2$ is the second capacitance, and $C_3$ is the third capacitance.

2. The circuit according to claim 1, further comprising a switching module, wherein the switching module is configured to connect the capacitance detection module to the first capacitor set, the second capacitor set and the third capacitor set, respectively.

3. The circuit according to claim 2, wherein the switching module comprises a first switch and a second switch, and both the first switch and the second switch each comprise a first contact, a second contact, and a third contact, wherein the first contact of the first switch and the first contact of the second switch are both connected to the capacitance detection module; the second contact of the first switch and the second contact of the second switch are both grounded; the third contact of the first switch is connected to a first terminal of the capacitor element, and grounded through the row capacitor element; and the third contact of the second switch is connected to a second terminal of the capacitor element, and grounded through the column capacitor element.

4. The circuit according to claim 3, wherein the processing module is configured to control the connection of the contacts in the first switch and the second switch to form three connection states, wherein
    in a first connection state of the three connection states, the capacitance detection module is respectively connected to one terminal of the capacitor element and the row capacitor element, and the other terminal of the capacitor element and the row capacitor element is grounded; and both terminals of the column capacitor element are grounded;
    in a second connection state of the three connection states, the capacitance detection module is respectively connected to one terminal of the capacitor element and the column capacitor element, and the other terminal of the capacitor element and the column capacitor element is grounded; and both terminals of the row capacitor element are grounded; and
    in a third connection state of the three connection states, the capacitance detection module is respectively connected to one terminal of the row capacitor element and the column capacitor element, and the other terminal of the capacitor row element and the column capacitor element is grounded; and both terminals of the capacitor element are connected to the capacitance detection module.

5. The circuit according to claim 1, further comprising: a switch module, wherein the capacitance detection module is configured to be connected to the capacitor array through the switch module; and
    the processing module is connected to the switch module, and configured to determine the capacitor element, and control the switch module to connect the capacitance detection module to the capacitor element.

6. The circuit according to claim 5, wherein the switch module comprises a plurality of row switches and a plurality of column switches, wherein each of the capacitor elements corresponds to one of the column switches and one of the row switches, and the processing module is configured to
    determine a target row switch and a target column switch corresponding to the capacitor element; and
    connect the target row switch and the target column switch to the capacitance detection module, ground other row switches than the target row switch in the plurality of row switches, and ground other column switches than the target column switch in the plurality of column switches.

7. The circuit according to claim 6, wherein each of the row switches and each of the column switches comprise a first connection terminal, wherein the first terminal of each of the capacitor elements is connected to the first connection terminal of one of the column switches, and the second terminal of each of the capacitor elements is connected to the first connection terminal of one of the row switches; and the processing module is further configured to connect the first connection terminal of the target row switch and the first connection terminal of the target column switch to the capacitance detection module, ground the first connection terminals of other row switches than the target row switch in the plurality of row switches, and ground the first connection terminals of other column switches than the target column switch in the plurality of column switches.

8. The circuit according to claim 7, wherein each of the row switches and each of the column switches further comprises a second connection terminal and a third connection terminal, wherein the second connection terminals of each of the row switches and each of the column switches are grounded, and the third connection terminals of each of the row switches and each of the column switches are connected to the capacitance detection module; and the processing module is further configured to:

connect the first connection terminal to the third connection terminal of the target column switch, and disconnect the first connection terminal from the second connection terminal;

connect the first connection terminal to the third connection terminal of the target row switch, and disconnect the first connection terminal from the second connection terminal;

connect the first connection terminals to the second connection terminals of other row switches than the target row switch in the plurality of row switches, and disconnect the first connection terminals from the third connection terminal; and connect the first connection terminals to the second connection terminals of other column switches than the target column switch in the plurality of column switches, and disconnect the first connection terminals from the third connection terminal.

9. The circuit according to claim 1, wherein the processing module is further configured to determine a capacitor element following the capacitor element as a newly capacitor element according to a preset detection sequence, and inform the capacitance detection module of the capacitor element; and the capacitance detection module is further configured to implement the operation of detecting the first capacitance, the second capacitance and the third capacitance and subsequent operations on the newly capacitor element, until all capacitor elements that require the detection of capacitance are detected according to the preset detection sequence.

10. An electronic device, comprising the capacitance detection circuit according to claim 1, the electronic device being provided with an electronic skin including the capacitor array on a surface.

11. The electronic device according to claim 10, wherein the electronic device is an intelligent robot, and the intelligent robot further comprises a main control module, wherein the main control module is configured to acquire the capacitance of at least one capacitor element in the capacitor array detected by the capacitance detection circuit, and control the intelligent robot to perform a predetermined action according to the capacitance.

12. The electronic device according to claim 10, wherein the capacitance detection circuit further comprises a switching module, wherein the switching module is configured to connect the capacitance detection module to the first capacitor set, the second capacitor set and the third capacitor set, respectively.

13. The electronic device according to claim 12, wherein the switching module comprises a first switch and a second switch, and both the first switch and the second switch each comprise a first contact, a second contact, and a third contact, wherein the first contact of the first switch and the first contact of the second switch are both connected to the capacitance detection module; the second contact of the first switch and the second contact of the second switch are both grounded; the third contact of the first switch is connected to a first terminal of the capacitor element, and grounded through the row capacitor element; and the third contact of the second switch is connected to a second terminal of the capacitor element, and grounded through the column capacitor element.

14. The electronic device according to claim 13, wherein the processing module is configured to control the connection of the contacts in the first switch and the second switch to form three connection states, wherein in a first connection state of the three connection states, the capacitance detection module is respectively connected to one terminal of the capacitor element and the row capacitor element, and the other terminal of the capacitor element and the row capacitor element is grounded; and both terminals of the column capacitor element are grounded;

in a second connection state of the three connection states, the capacitance detection module is respectively connected to one terminal of the capacitor element and the column capacitor element, and the other terminal of the capacitor element and the column capacitor element is grounded; and both terminals of the row capacitor element are grounded; and in a third connection state of the three connection states, the capacitance detection module is respectively connected to one terminal of the row capacitor element and the column capacitor element, and the other terminal of the capacitor row element and the column capacitor element is grounded; and both terminals of the capacitor element are connected to the capacitance detection module.

15. The electronic device according to claim 10, wherein the capacitance detection circuit further comprises: a switch module, wherein the capacitance detection module is configured to be connected to the capacitor array through the switch module; and the processing module is connected to the switch module, and configured to determine the capacitor element, and control the switch module to connect the capacitance detection module to the capacitor element.

16. The electronic device according to claim 15, wherein the switch module comprises a plurality of row switches and a plurality of column switches, wherein each of the capacitor elements corresponds to one of the column switches and one of the row switches, and the processing module is configured to determine a target row switch and a target column switch corresponding to the capacitor element; and connect the target row switch and the target column switch to the capacitance detection module, ground other row switches than the target row switch in the plurality of row switches, and ground other column switches than the target column switch in the plurality of column switches.

17. The electronic device according to claim 10, wherein the processing module is further configured to determine a capacitor element following the capacitor element as a newly capacitor element according to a preset detection sequence, and inform the capacitance detection module of the capacitor element; and the capacitance detection module is further configured to implement the operation of detecting the first capacitance, the second capacitance and the third capacitance and subsequent operations on the newly capacitor element, until all capacitor elements that require the detection of capacitance are detected according to the preset detection sequence.

18. A method for detecting capacitance of a capacitor element within a capacitor array, the method comprising:

detecting a first capacitance of a first capacitor set, a second capacitance of a second capacitor set, and a third capacitance of the third capacitor set, the first capacitor set comprising the capacitor element and a row capacitor element in a same row of the capacitor array as the capacitor element, the second capacitor set comprising the capacitor element and a column capacitor element in a same column of the capacitor array as the capacitor element, the third capacitor set comprising the row capacitor element and the column capacitor element; and obtaining the capacitance of the capacitor element according to the first capacitance, the second capacitance and the third capacitance by:

determining the capacitance of the capacitor element by the formula:

$$C_t = (C_1 + C_2 - C_3)/2.$$

wherein $C_t$ is the capacitance of the capacitor element, $C_1$ is the first capacitance, $C_2$ is the second capacitance, and $C_3$ is the third capacitance.

19. The method according to claim 18, wherein the obtaining the capacitance of the capacitor element according to the first capacitance, the second capacitance and the third capacitance further comprises:

determining a capacitor element following the capacitor element as a newly capacitor element according to a preset detection sequence, and implementing the operation of detecting the first capacitance, the second capacitance and the third capacitance and subsequent operations again, until all capacitor elements that require the detection of capacitance are detected according to the preset detection sequence.

* * * * *